United States Patent
Sharma et al.

(10) Patent No.: US 10,372,037 B2
(45) Date of Patent: Aug. 6, 2019

(54) CONSTRUCTING FILL SHAPES FOR DOUBLE-PATTERNING TECHNOLOGY

(71) Applicant: Synopsys, Inc., Mountain View, CA (US)

(72) Inventors: Himanshu Sharma, Mountain View, CA (US); Byungwook Kim, Los Altos Hills, CA (US); Virender Kashyap, Noida (IN); Abhishek Khandelwal, Noida (IN)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/929,113

(22) Filed: Oct. 30, 2015

(65) Prior Publication Data
US 2017/0124242 A1    May 4, 2017

(51) Int. Cl.
| G06F 17/50 | (2006.01) |
|---|---|
| G03F 7/00 | (2006.01) |
| G03F 1/68 | (2012.01) |
| G03F 1/70 | (2012.01) |
| G03F 7/20 | (2006.01) |

(52) U.S. Cl.
CPC .............. *G03F 7/0035* (2013.01); *G03F 1/68* (2013.01); *G03F 1/70* (2013.01); *G03F 7/70466* (2013.01); *G06F 17/5072* (2013.01); *G06F 17/5081* (2013.01)

(58) Field of Classification Search
CPC .. G06F 17/5081; G06F 2217/12; G06F 17/50; G06F 17/5072; G06F 17/5077; G06F 2217/06; G03F 1/70; G03F 7/70466; G03F 1/36; G03F 7/2022; G03F 7/70283; G03F 7/70475; G03F 7/0035; H01L 23/528

USPC ................... 716/50–55; 430/5, 30
See application file for complete search history.

(56) References Cited

U.S. PATENT DOCUMENTS

| 6,408,428 B1 | 6/2002 | Schlansker et al. |
|---|---|---|
| 6,421,809 B1 | 7/2002 | Wuytack et al. |
| 6,704,921 B2 | 3/2004 | Liu |
| 6,829,216 B1 | 12/2004 | Nakata |
| 7,049,589 B2 | 5/2006 | Yamaguchi et al. |
| 7,114,141 B1 | 9/2006 | Teig et al. |

(Continued)

FOREIGN PATENT DOCUMENTS

| WO | WO 14/130783 A1 | 8/2014 |
|---|---|---|
| WO | WO 15/023856 A1 | 2/2015 |

OTHER PUBLICATIONS

Beigel et al., "3-Coloring in Time 0(1.3289")," Journal of Algorithms, 54: 168-204, (2005).

(Continued)

*Primary Examiner* — Nghia M Doan
(74) *Attorney, Agent, or Firm* — Alston & Bird LLP

(57) ABSTRACT

A computer-implemented method for constructing a design characterized by a double patterning layer is presented. The method includes receiving the design in a memory of the computer when the computer is invoked to construct the design. The method further includes generating, using the computer, a multitude of fill shapes along a multitude of tracks associated with a multitude of net shapes. The multitude of fill shapes and the multitude of net shapes are decomposable into two colors in accordance with a spacing constraint of the double patterning layer.

21 Claims, 20 Drawing Sheets

(56) References Cited

U.S. PATENT DOCUMENTS

| | | |
|---|---|---|
| 7,560,201 B2 | 7/2009 | Liu |
| 7,647,212 B2 | 1/2010 | Andreoli et al. |
| 7,653,892 B1 | 1/2010 | Gennari et al. |
| 8,069,423 B2 | 11/2011 | Ghan et al. |
| 8,190,547 B2 | 5/2012 | Kirovski |
| 8,209,656 B1 | 6/2012 | Wang et al. |
| 8,312,394 B2 | 11/2012 | Ban et al. |
| 8,316,329 B1 | 11/2012 | Rigby et al. |
| 8,327,299 B1 | 12/2012 | Gennari |
| 8,359,556 B1 | 1/2013 | Ghaida et al. |
| 8,402,396 B2 | 3/2013 | Kahng et al. |
| 8,434,043 B1 | 4/2013 | Hsu et al. |
| 8,448,100 B1 | 5/2013 | Lin et al. |
| 8,473,873 B2 | 6/2013 | Hsu et al. |
| 8,484,607 B1 | 7/2013 | Tang et al. |
| 8,515,724 B2 | 8/2013 | Joshi et al. |
| 8,516,403 B2 | 8/2013 | Abou Ghaida et al. |
| 8,601,409 B1 | 12/2013 | Chen et al. |
| 8,661,371 B1 | 2/2014 | Wang |
| 8,677,297 B2 | 3/2014 | Chase et al. |
| 8,751,974 B2 | 6/2014 | Kahng et al. |
| 8,875,065 B1 | 10/2014 | Lin et al. |
| 9,141,752 B2 | 9/2015 | Lin et al. |
| 9,158,885 B1 | 10/2015 | Gray et al. |
| 9,298,084 B2 | 3/2016 | Luo |
| 9,360,750 B2 | 6/2016 | Lin et al. |
| 9,384,319 B2 | 7/2016 | Cilingir et al. |
| 9,740,814 B1 | 8/2017 | Ghosh |
| 9,904,756 B1* | 2/2018 | Ruehl ............... G06F 17/5081 |
| 2002/0083410 A1* | 6/2002 | Wu ..................... G03F 1/30 716/52 |
| 2009/0070550 A1 | 3/2009 | Solomon |
| 2010/0050146 A1 | 2/2010 | Frankle et al. |
| 2010/0064269 A1 | 3/2010 | Lai et al. |
| 2011/0014786 A1* | 1/2011 | Sezginer ............ G06F 17/5077 438/618 |
| 2011/0052088 A1 | 3/2011 | Yuan et al. |
| 2011/0078638 A1 | 3/2011 | Kahng et al. |
| 2011/0197168 A1 | 8/2011 | Chen et al. |
| 2011/0284996 A1 | 11/2011 | Kurusu et al. |
| 2013/0007674 A1 | 1/2013 | Abou Ghaida et al. |
| 2013/0024822 A1* | 1/2013 | Hsieh ..................... G03F 1/70 716/52 |
| 2013/0036397 A1 | 2/2013 | Lee et al. |
| 2013/0061183 A1 | 3/2013 | Abou Ghaida et al. |
| 2013/0061185 A1 | 3/2013 | Abou Ghaida et al. |
| 2013/0074018 A1 | 3/2013 | Hsu et al. |
| 2013/0174106 A1 | 7/2013 | Hsu et al. |
| 2014/0007026 A1 | 1/2014 | Chen et al. |
| 2014/0053118 A1 | 2/2014 | Chen et al. |
| 2014/0189611 A1 | 7/2014 | Lai et al. |
| 2014/0244215 A1 | 8/2014 | Nakayama et al. |
| 2014/0245237 A1 | 8/2014 | Cilingir et al. |
| 2014/0282293 A1 | 9/2014 | Lin et al. |
| 2014/0372958 A1 | 12/2014 | Lin et al. |
| 2015/0040077 A1* | 2/2015 | Ho ..................... G03F 7/70466 716/51 |
| 2015/0234974 A1 | 8/2015 | Dechene et al. |
| 2015/0286771 A1 | 10/2015 | Choi et al. |
| 2017/0004251 A1 | 1/2017 | Cilingir et al. |
| 2017/0147740 A1 | 5/2017 | Chang |
| 2017/0206300 A1 | 7/2017 | Xue et al. |
| 2017/0336707 A1 | 11/2017 | Choi et al. |

OTHER PUBLICATIONS

Dorigo et al., "An Introduction to Ant Colony Optimization," Universite Libre de Bruxelles Institut de Recherches Interdisciplinaires et de Developpements en Intelligence Artificielle (IRIDIA) Technical Report No. TR/IRIDIA/2006-010, 22 pages, (2006).
Fang et al., "A novel layout decomposition algorithm for triple patterning lithography,"in IEEE Trans. on Computer-Aided Design of Integrated Circuits and Systems (TCAD), 33(3),:397-408, (2014).
Fister et al., "Using differential evolution for the graph coloring," Differential Evolution (SDE), IEEE, Symposium on Apr. 11, 2011, pp. 1-7, doi: 10.1109/SDE.2011.5952075, (2011).
Galinier et al.; "Hybrid Evolutionary Algorithms for Graph Coloring" Journal of Combinatorial Optimization, Kluwer Academic Publishers, pp. 1-33, (1999).
Grosan et al., "Hybrid Evolutionary Algorithms: Methodologies, Architectures, and Reviews," Studies in Computational Intelligence (SCI), 75:1-17, (2007).
Kuang et al., "An Efficient Layout Decomposition Approach for Triple Patterning Lithography," In: Design Automation Conference (DAC) 2013, pp. 1-6, (2013).
Li et al., "14nm M1 Triple Patterning," Proceedings of the International Society for Optics and Photonics (SPIE), 8326:832612-1-832612-7, (2012).
Tian et al., "A polynomial time triple patterning algorithm for cell based row-structure layout," Computer-Aided Design, pp. 57-64, doi: 10.1145/2429384.2429396 (2012).
Yu et al., "Layout Decomposition for Triple Patterning Lithography," 2011 Institute of Electrical and Electronics Engineers/ Association for Computing Machinery International Conference on Computer-Aided Design (ICCAD), pp. 1-8, (2011).
EPO Application No. 14753896.1, European Search Report and European Search Opinion dated Dec. 20, 2016.
Taiwanese Application No. 103105938, First Office Action dated Jun. 5, 2015.
Taiwanese Application No. 103105938, Second Office Action dated Oct. 5, 2015.
U.S. Appl. No. 14/185,717, Final Office Action dated Jan. 13, 2017.
U.S. Appl. No. 14/185,717, Non-Final Office Action dated Apr. 5, 2016.
U.S. Appl. No. 14/459,657, Non-Final Office Action dated Oct. 7, 2015.
U.S. Appl. No. 14/459,657, Notice of Allowance dated Mar. 11, 2016.
U.S. Appl. No. 14/678,831, Final Office Action dated Dec. 23, 2016.
U.S. Appl. No. 14/678,831, Non-Final Office Action dated Apr. 27, 2016.
U.S. Appl. No. 15/179,890, Non-Final Office Action dated Mar. 13, 2017.
WIPO Application No. PCT/US2014/017619, PCT International Preliminary Report on Patentability dated Aug. 25, 2015.
WIPO Application No. PCT/US2014/017619, PCT International Search Report dated May 30, 2014.
WIPO Application No. PCT/US2014/017619, PCT Written Opinion of the International Searching Authority dated May 30, 2014.
WIPO Application No. PCT/US2014/051086, PCT International Preliminary Report on Patentability dated Feb. 15, 2016.
WIPO Application No. PCT/US2014/051086, PCT International Search Report dated Nov. 25, 2014.
WIPO Application No. PCT/US2014/051086, PCT Written Opinion of the International Searching Authority dated Nov. 25, 2014.
Knuth, "Dancing Links," arxiv.org, Cornell University Library, arXiv:cs/0011047 [cs.DS], 26 pages, (2000).
EPO Application No. 14753896.1, Reply to the Opinion with the European Search Report dated Jun. 21, 2017.
EPO Application No. 16200435.2 (Published as EP3193271), European Search Report and European Search Opinion dated Jun. 21, 2017.
U.S. Appl. No. 14/185,717, Non-Final Office Action dated Aug. 15, 2017.
U.S. Appl. No. 14/678,831, Notice of Allowance dated Jul. 12, 2017.
U.S. Appl. No. 14/996,796, Non-Final Office Action dated Aug. 22, 2017.
U.S. Appl. No. 15/179,890, Non-Final Office Action dated Oct. 4, 2017.
U.S. Appl. No. 14/185,717, Final Office Action dated May 11, 2018.
U.S. Appl. No. 14/996,796, Final Office Action dated May 3, 2018.
U.S. Appl. No. 15/179,890, Notice of Allowance dated May 10, 2018.
U.S. Appl. No. 15/359,579, Non-Final Office Action dated Apr. 16, 2018.

(56) References Cited

OTHER PUBLICATIONS

U.S. Appl. No. 15/669,502, Non-Final Office Action dated Dec. 26, 2017.
U.S. Appl. No. 14/185,717, Non-Final Office Action dated Oct. 11, 2018.
U.S. Appl. No. 15/179,890, Notice of Allowance dated Sep. 12, 2018.
U.S. Appl. No. 15/669,502, Notice of Allowance dated Aug. 16, 2018.
U.S. Appl. No. 14/996,796, Non-Final Office Action dated Nov. 16, 2018.
U.S. Appl. No. 15/179,890, Non-Final Office Action dated Jan. 4, 2019.
U.S. Appl. No. 15/359,579, Final Office Action dated Nov. 26, 2018.
U.S. Appl. No. 15/669,502, Notice of Allowance dated Jan. 15, 2019.

* cited by examiner

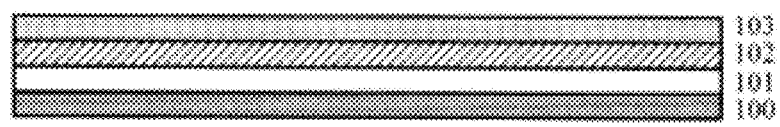
Figure 19A
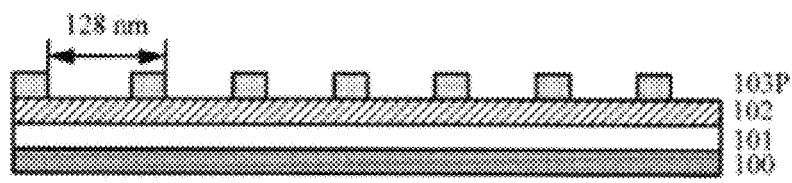
Figure 19B
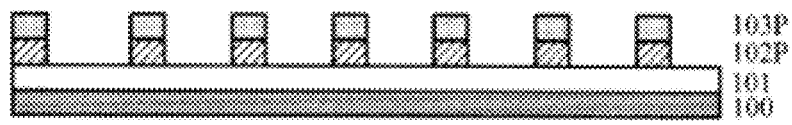
Figure 19C
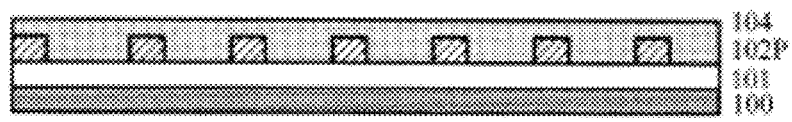
Figure 19D
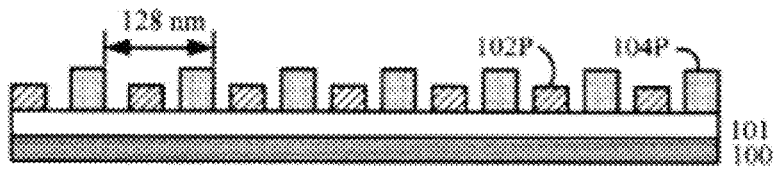
Figure 19E
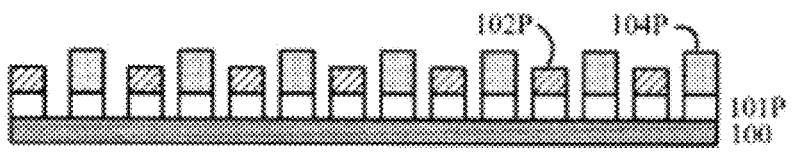
Figure 19F
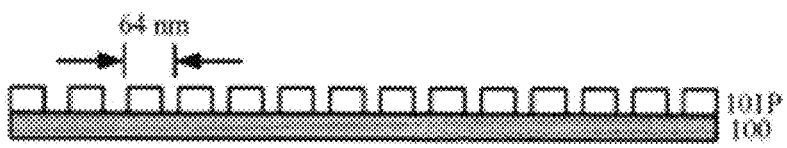
Figure 19G
*FIG. 19*

CONSTRUCTING FILL SHAPES FOR DOUBLE-PATTERNING TECHNOLOGY

CROSS-REFERENCES TO RELATED APPLICATIONS

This application is related to U.S. Pat. No. 8,701,056 B1, filed on Sep. 26, 2012, entitled "AUTOMATED REPAIR METHOD AND SYSTEM FOR DOUBLE PATTERNING CONFLICTS" by Paul David Friedberg, et al., the contents of all of which are incorporated herein by reference in their entirety.

BACKGROUND

The present disclosure relates to electronic design automation (EDA), and more particularly to constructing integrated circuit (IC) design intents requiring double-patterning technique (DPT) by adding fill shapes to a layer of the design intent at a DPT spacing rule.

Improvements in semiconductor process technology can increase the pattern density of shapes printed into a layer on the surface of a wafer below the minimum manufacture-able line-and-space-width, hereinafter also referred to as "minimum pitch", that is achievable using just a single mask to pattern the layer for a given generation of photolithography printing technology. As an example, double-patterning technique or technology (DPT) has been used for manufacturing a design intent, hereinafter also referred to as "layout pattern," "design shapes," or "shapes," having more than a single pitch within the spacing of a single minimum pitch that is printable by using just a single photolithographic mask. DPT uses two different masks to produce higher pattern surface density in a process layer of the design intent than is achievable by using just one mask to print that layer. However, double-patterning technology requires special design rules, EDA, and wafer processing procedures that are more complicated than standard photolithography printing technology.

Advanced process technologies use chemical mechanical polishing (CMP) techniques to flatten or "planarize" the surface of a semiconductor wafer as flat as possible during a multitude of processing steps. A flat wafer surface is desirable to obtain the wider manufacturing tolerance for depth of focus during advanced photolithographic printing as well as maintain uniform thicknesses of process layers on the wafer surface. However, the rate of CMP material removal from the wafer surface at the individual chip scale may vary in accordance with the type of materials, the distribution, and pattern density of the materials or density of material shapes per unit of polishing surface area.

For example, a soft material such as a metal may polish faster than a relatively harder material such as a dielectric material. A design intent may include a memory core region that includes a multitude of metal shapes spaced at minimum pitch resulting in a high density of metal shape per unit of surface area and may also include a region outside the memory core, hereinafter also referred to as "periphery," that includes fewer metal shapes at a lower density of metal shape per unit of surface area relative to the memory array. Such differences in density of metal shape per unit surface area on an integrated circuit (IC) die may cause the memory core to polish faster during CMP than the periphery of the IC die, which results in a problem called "dishing."

In this example, the dishing after CMP may cause the surface of the periphery to be higher than the surface of the array, which may reduce subsequent manufacturing margins. In some cases, the remaining metal in the array may be thinned by the dishing below reliable current handling limits for IC power and signal lines running in the array region of the design intent. The dishing problem may become worse when some regions of the design intent use DPT, which may for example, greatly increases density of metal shape per unit of surface area compared to other regions of the design intent at lower density of metal shape per unit of surface area.

One solution to lessen the dishing problem caused by CMP is to add additional shapes, hereinafter also referred to as "fill shapes," to a layer of the design intent that are not part of the design's original electrical schematic or net-list. The fill shapes are added in order to better equalize the density of a material shape per unit of surface area across the surface of the IC die. For example, after metal lines are routed by the EDA tool, additional metal fill shapes may be added to the design intent layer by the EDA tool in places that are not used by the routing of schematic or net-list specified shapes or lines. Typically, fill shape placement has not been used in regions of the design intent requiring DPT due to the complications of combining fill shape placement that are also DPT compatible without sacrificing density of metal shape per unit surface area. For example, the memory array region of the design intent may use DPT and the fill shapes added in the periphery are placed at relatively large spacing away from the DPT shapes in the array. Further, the region with fill shapes may not be using the higher pattern density DPT design rules and suffer more dishing effects than the signal shapes that do use DPT rules in the array.

Accordingly, there is a need to enable EDA tools to add fill shapes in regions of the die that use DPT design rules in order to reduce dishing problems during CMP for advanced IC manufacturing technologies.

SUMMARY

According to one embodiment of the present invention, a computer-implemented method for constructing a design characterized by a double patterning layer is presented. The method includes receiving the design in a memory of the computer when the computer is invoked to construct the design. The method further includes generating, using the computer, a multitude of fill shapes along a multitude of tracks associated with a multitude of net shapes. The multitude of fill shapes and the multitude of net shapes are decomposable into two colors in accordance with a spacing constraint of the double patterning layer.

According to one embodiment, generating further includes decomposing the multitude of net shapes into the two colors in accordance with a graph. Generating further includes surrounding each decomposed net shape with a blocking region associated with a color of the two colors that corresponds to the color of the decomposed net shape to form a multitude of blocking regions, and constructing the multitude of fill shapes in accordance with the multitude of blocking regions. According to one embodiment, constructing further includes constructing each one of the multitude of fill shapes along a different one of the multitude of tracks except wherever one of the multitude of blocking regions is associated with the same color as the color associated with the each one of the multitude of fill shapes.

According to one embodiment, any immediately adjacent tracks of the multitude of tracks are assigned to alternating different colors of the two colors. Constructing further includes associating each one of the multitude of fill shapes with the same color as the color associated with the track of the multitude of tracks that the fill shape is disposed along.

According to one embodiment, surrounding further includes sizing each one of the multitude of blocking regions such that each blocking region overlaps the associated decomposed net shape in a direction along a longitudinal axis of the multitude of tracks by a value associated with a first shape to second shape constraint of the double patterning layer. The first shape and the second shape are associated with the same color. According to one embodiment, surrounding further includes sizing each one of the multitude of blocking regions such that each blocking region overlaps the associated decomposed net shape in a direction orthogonal to a longitudinal axis of the multitude of tracks by a value associated with a track pitch constraint of the double patterning layer.

According to one embodiment, the two colors include a first color and a second color different from the first color. The multitude of tracks are each sequentially numbered and include a multitude of even numbered tracks and a multitude of odd numbered tracks. The method further includes assigning, using the computer, the first color to the multitude of even numbered tracks, and assigning, using the computer, the second color to the multitude of odd numbered tracks, thereby assigning any immediately adjacent tracks of the multitude of tracks to alternating different colors, when immediately adjacent tracks are not previously assigned to alternating different colors.

According to one embodiment, the method further includes creating a graph characterized by having a multitude of vertices each associated with a different one of the multitude of net shapes, and a multitude of edges each joining a pair of the multitude of vertices when an immediately adjacent pair of the multitude of net shapes associated with the pair of the multitude of vertices are constrained by the spacing constraint of the double patterning layer. The method further includes selecting a selected one of the multitude of net shapes in accordance with a minimum width constraint of the double patterning layer. The selected net shape is disposed along one of the multitude of tracks. The method further includes designating one of the multitude of vertices associated with the selected net shape to a color of the two colors that is associated with the color of the track upon which the selected net shape is disposed along. The method further includes decomposing the multitude of vertices in the graph into the two colors in accordance with the designated one of the multitude of vertices, and assigning the two colors to the multitude of net shapes in accordance with the decomposed graph.

According to one embodiment of the present invention, a computer system is operative to receive a design, characterized by a double patterning layer, in a memory of the computer when the computer is invoked to construct the design, and generate a multitude of fill shapes along a multitude of tracks associated with a multitude of net shapes. The multitude of fill shapes and the multitude of net shapes are decomposable into two colors in accordance with a spacing constraint of the double patterning layer.

According to one embodiment, the computer system is further operative to decompose the multitude of net shapes into the two colors in accordance with a graph. The computer system is further operative to surround each decomposed net shape with a blocking region associated with a color of the two colors that corresponds to the color of the decomposed net shape to form a multitude of blocking regions, and construct the multitude of fill shapes in accordance with the multitude of blocking regions.

According to one embodiment, the computer system is further operative to construct each one of the multitude of fill shapes along a different one of the multitude of tracks except wherever one of the multitude of blocking regions is associated with the same color as the color associated with the each one of the multitude of fill shapes. According to one embodiment, any immediately adjacent tracks of the multitude of tracks are assigned to alternating different colors of the two colors, the computer system further operative to associate each one of the multitude of fill shapes with the same color as the color associated with the track of the multitude of tracks that the fill shape is disposed along.

According to one embodiment, the computer system is further operative to size each one of the multitude of blocking regions such that each blocking region overlaps the associated decomposed net shape in a direction along a longitudinal axis of the multitude of tracks by a value associated with a first shape to second shape constraint of the double patterning layer. The first shape and the second shape are associated with the same color. According to one embodiment, the computer system is further operative to size each one of the multitude of blocking regions such that each blocking region overlaps the associated decomposed net shape in a direction orthogonal to a longitudinal axis of the multitude of tracks by a value associated with a track pitch constraint of the double patterning layer.

According to one embodiment, the two colors include a first color and a second color different from the first color. The multitude of tracks are each sequentially numbered and include a multitude of even numbered tracks and a multitude of odd numbered tracks. The computer system is further operative to assign the first color to the multitude of even numbered tracks, and assign the second color to the multitude of odd numbered tracks, thereby operative to assign any immediately adjacent tracks of the multitude of tracks to alternating different colors, when immediately adjacent tracks are not previously assigned to alternating different colors.

According to one embodiment, the computer system is further operative to create a graph characterized by having a multitude of vertices each associated with a different one of the multitude of net shapes, and a multitude of edges each joining a pair of the multitude of vertices when an immediately adjacent pair of the multitude of net shapes associated with the pair of the multitude of vertices are constrained by the spacing constraint of the double patterning layer. The computer system is further operative to select a selected one of the multitude of net shapes in accordance with a minimum width constraint of the double patterning layer. The selected net shape is disposed along one of the multitude of tracks. The computer system is further operative to designate one of the multitude of vertices associated with the selected net shape to a color of the two colors that is associated with the color of the track upon which the selected net shape is disposed along. The computer system is further operative to decompose the multitude of vertices in the graph into the two colors in accordance with the designated one of the multitude of vertices, and assign the two colors to the multitude of net shapes in accordance with the decomposed graph.

According to one embodiment of the present invention, a non-transitory computer-readable storage medium includes instructions, which when executed by a computer, cause the computer to receive a design, characterized by a double patterning layer, in a memory of the computer when the computer is invoked to construct the design. The instructions further cause the computer to generate a multitude of fill shapes along a multitude of tracks associated with a multitude of net shapes. The multitude of fill shapes and the multitude of net shapes are decomposable into two colors in accordance with a spacing constraint of the double patterning layer.

According to one embodiment, the instructions further cause the computer to decompose the multitude of net shapes into the two colors in accordance with a graph. The instructions further cause the computer to surround each decomposed net shape with a blocking region associated with a color of the two colors that corresponds to the color of the decomposed net shape to form a multitude of blocking regions, and construct the multitude of fill shapes in accordance with the multitude of blocking regions. According to one embodiment, the instructions further cause the computer to construct each one of the multitude of fill shapes along a different one of the multitude of tracks except wherever one of the multitude of blocking regions is associated with the same color as the color associated with the each one of the multitude of fill shapes.

According to one embodiment, any immediately adjacent tracks of the multitude of tracks are assigned to alternating different colors of the two colors. The instructions further cause the computer to associate each one of the multitude of fill shapes with the same color as the color associated with the track of the multitude of tracks that the fill shape is disposed along.

According to one embodiment, the instructions further cause the computer to size each one of the multitude of blocking regions such that each blocking region overlaps the associated decomposed net shape in a direction along a longitudinal axis of the multitude of tracks by a value associated with a first shape to second shape constraint of the double patterning layer. The first shape and the second shape are associated with the same color. According to one embodiment, the instructions further cause the computer to size each one of the multitude of blocking regions such that each blocking region overlaps the associated decomposed net shape in a direction orthogonal to a longitudinal axis of the multitude of tracks by a value associated with a track pitch constraint of the double patterning layer.

According to one embodiment, the two colors include a first color and a second color different from the first color. The multitude of tracks are each sequentially numbered and include a multitude of even numbered tracks and a multitude of odd numbered tracks. The instructions further cause the computer to assign the first color to the multitude of even numbered tracks, and assign the second color to the multitude of odd numbered tracks, thereby operative to assign any immediately adjacent tracks of the multitude of tracks to alternating different colors, when immediately adjacent tracks are not previously assigned to alternating different colors.

According to one embodiment, the instructions further cause the computer to create a graph characterized by having a multitude of vertices each associated with a different one of the multitude of net shapes, and a multitude of edges each joining a pair of the multitude of vertices when an immediately adjacent pair of the multitude of net shapes associated with the pair of the multitude of vertices are constrained by the spacing constraint of the double patterning layer. The instructions further cause the computer to select a selected one of the multitude of net shapes in accordance with a minimum width constraint of the double patterning layer. The selected net shape is disposed along one of the multitude of tracks. The instructions further cause the computer to designate one of the multitude of vertices associated with the selected net shape to a color of the two colors that is associated with the color of the track upon which the selected net shape is disposed along. The instructions further cause the computer to decompose the multitude of vertices in the graph into the two colors in accordance with the designated one of the multitude of vertices, and assign the two colors to the multitude of net shapes in accordance with the decomposed graph.

A better understanding of the nature and advantages of the embodiments of the present invention may be gained with reference to the following detailed description and the accompanying drawings.

BRIEF DESCRIPTION OF THE DRAWINGS

FIG. 19 depicts a series of exemplary process cross sections of one double patterning process that may implement the features, aspects, and steps of the methods discussed herein.

DETAILED DESCRIPTION

Figure 1:
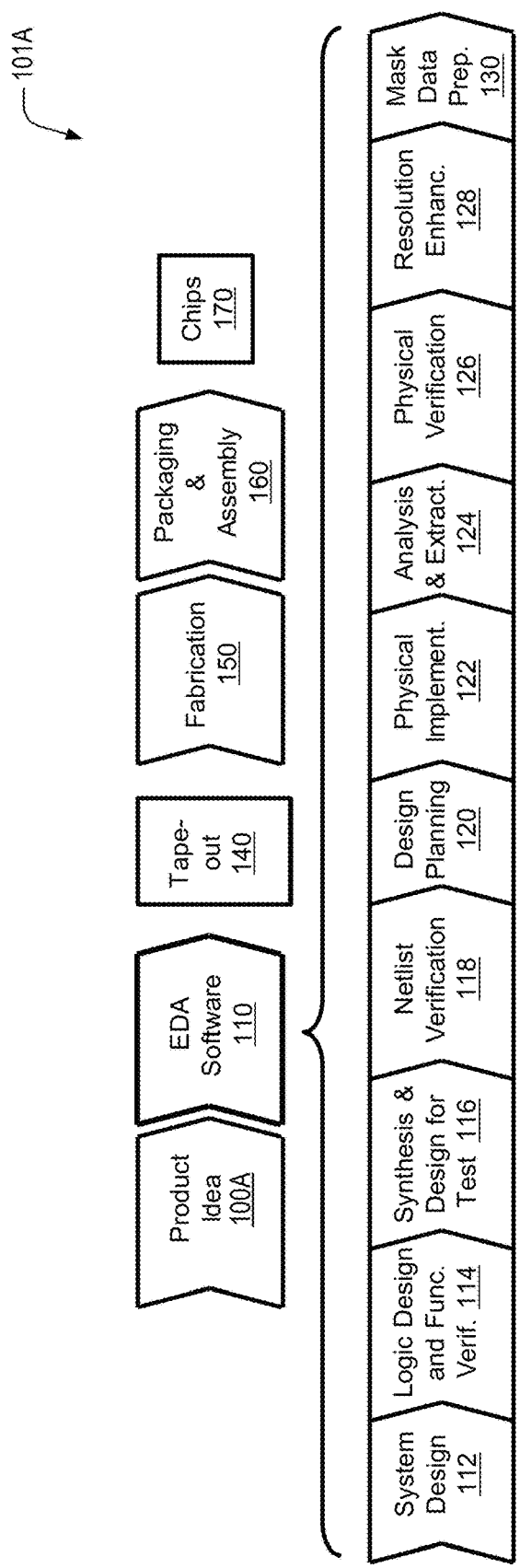
FIG. 1 depicts simplified exemplary steps in the design and fabrication of an integrated circuit that may use embodiments of the present invention.

FIG. 1 depicts various steps 101A in the design and fabrication of an integrated circuit. The process starts with a product idea 100A, which may be realized using Electronic Design Automation (EDA) software 110. Chips 170 can be produced from the finalized design by performing fabrication 150 and packaging and assembly 160 steps. An exemplary design flow that uses EDA software 110 is described below for illustration purposes only. For example, an actual integrated circuit design may require a designer to perform the design flow steps in a different sequence than the sequence described below.

In the system design 112, a designer describes the functionality to be implemented. The designer can also perform what-if planning to refine the functionality and to check costs. Further, hardware-software architecture partitioning can occur at this step. In the design and functional verification 114, a Hardware Description Language (HDL) design may be created and checked for functional accuracy.

In the synthesis and design 116, the HDL code can be translated to a netlist, which can be optimized for the target technology. Further, tests may be designed and implemented to check the finished chips. In the netlist verification 118, the netlist may be checked for compliance with timing constraints and for correspondence with the HDL code. In the design planning 120, an overall floor plan for the chip can be constructed and analyzed for timing and top-level routing. Next, in the physical implementation 122, placement and routing may be performed.

In the analysis and extraction 124, the circuit functionality may be verified at a transistor level. In the physical verification 126, the design may be checked to correct any functional, manufacturing, electrical, or lithographic issues. In the resolution enhancement 128, geometric manipulations may be performed on the layout to improve manufacturability of the design. Finally, in the mask data preparation 130, the design can be taped-out 140 for production of masks to produce finished chips. The embodiments of the present invention may be used, for example at the steps of either physical verification 126, resolution enhancement 128, and/or mask data preparation 130. A DPT lithography process may be used to print complex design intents or shapes on a single layer of an IC process using two separate masks with higher pattern density than the pattern density provided by using a single mask photolithographic printing process, as will be described in greater detail below.

Figure 2:
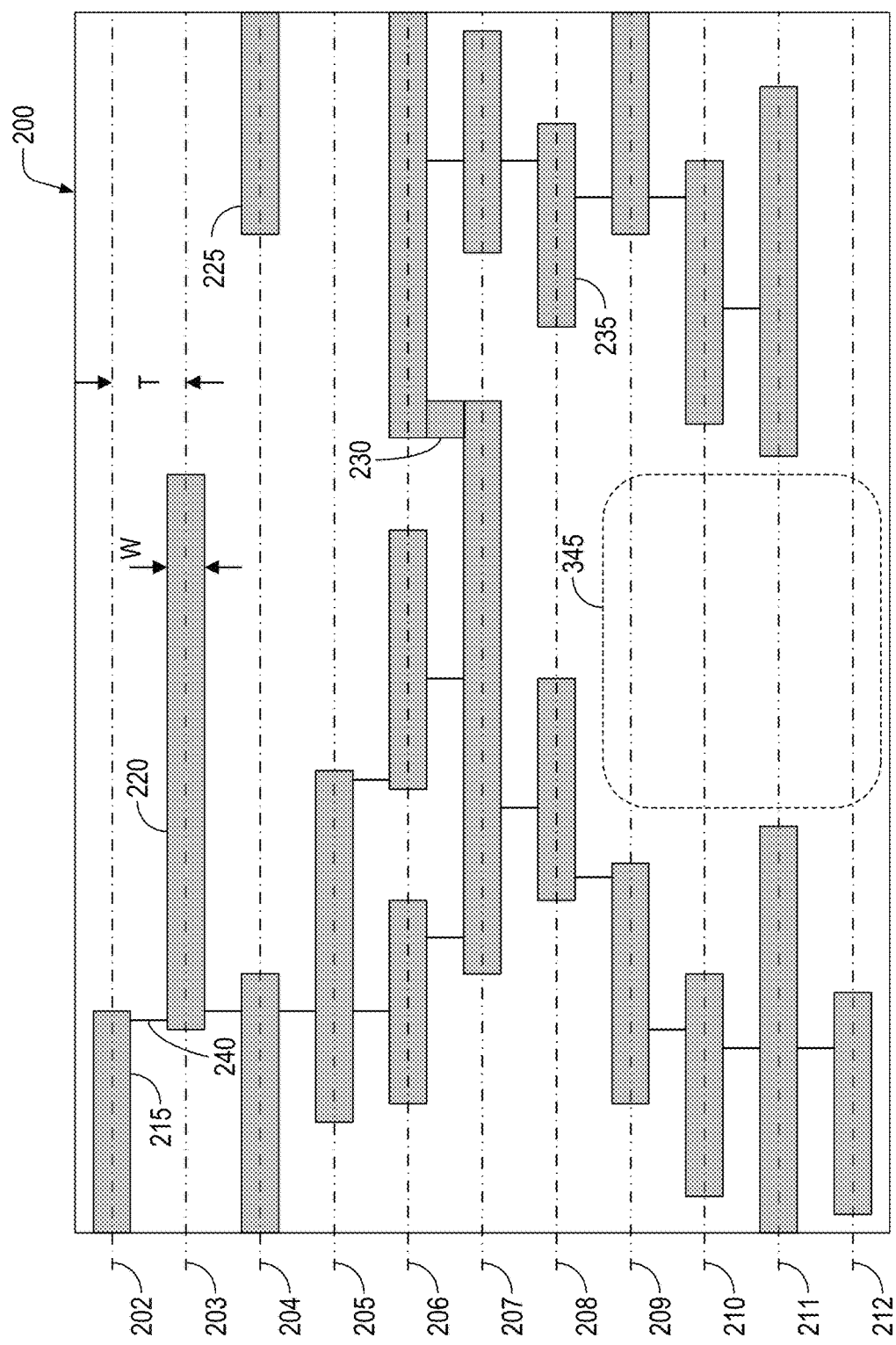
FIG. 2 depicts an example of a portion of one signal layer of a design intent that may use embodiments of the present invention.

FIG. 2 depicts an example of a portion of one signal layer 200 of a design intent that may use embodiments of the present invention. The signal layer, hereinafter also referred to as a "double patterning layer," may correspond to a single metal layer of an IC chip that requires double patterning technology. Portion of one signal layer 200 may include a multitude of tracks 202-212 depicted as dashed/dotted and/or dashed/double dotted lines along the centerline of the multitude of tracks and a multitude of signal or net shapes 215-235. Portion of one signal layer 200 may further include a region 345, where there are no net shapes located in the design intent, of relatively low density of shape per unit of surface area compared to surrounding regions directly adjacent above and to the sides of region 345 as depicted.

Each of the multitude of tracks 202-212 may be oriented with a longitudinal centerline disposed in the same direction, e.g. along the x-axis, and spaced equidistantly from another immediately adjacent track with a predetermined spacing T in the direction orthogonal to the longitudinal centerline of each track, e.g. in the y-axis direction as depicted. In one embodiment, T may be related to a minimum pitch design rule or constraint for shapes to be patterned using DPT. Tracks may provide an orderly positioning framework for the preferred intended locations of net shapes, but not preventing net shapes from joining from one track to another such as net shape 230, in the one signal layer of the IC layout.

Each of the multitude of net shapes 215-235 may include a longitudinal axis disposed substantially along the centerline of a different one of the multitude of tracks 202-212. Each of the multitude of net shapes 215-235 may be adapted to conduct a signal associated with a net of a netlist, which represents the electrical functions of the IC. Each of the multitude of net shapes 215-235 may be characterized as having a predetermined width, W, in the direction orthogonal to the longitudinal axis of the net shape, e.g. in the y-axis direction. In one embodiment, W may be related to a minimum width design rule or constraint, minWidth, for a shape to be patterned using DPT. In another embodiment, W may have a value larger than minWidth, such as for example when a net shape is so wide that a shape (not shown) may span across more than one track.

T and W may frequently be characterized by the relationship T−W=an allowable spacing rule or constraint of the double patterning layer, hereinafter also referred to as "min-Spacing," which is depicted by the short line segment called a link 240. In one embodiment, the rule or constraint minSpacing is related to the minimum allowable spacing between a pair of immediately adjacent shapes of different masks/colors of the same double patterning layer as will be explained in greater detail below. In other words, usually tracks are arranged so that T=minSpacing+minWidth. Generally, T, W, and minSpacing may be characterized by the relationship T>=minSpacing+minWidth.

The allowable minSpacing depicted by link 240 requires that net shapes 215, 220 immediately adjacent to link 240 may not be placed on the same mask but are allowed to be placed on different DPT masks, i.e. different colors, used to pattern the single signal layer using DPT. Therefore, net shape 215 may be assigned to a mask A and net shape 220 may be assigned to a different mask B, where masks A and B are two masks both used in DPT to pattern the single signal layer. The single signal layer may correspond to a single metal layer of an IC chip that requires double patterning technology due to the small spacing required between adjacent net shapes. Portion of one signal layer 200 may include a multitude of links 240. It is noted that each of the multitude of links 240 is between a pair of shapes disposed along immediately adjacent tracks and that no links are present between a pair of shapes disposed along the same track.

The design intent may not be constrained so as to exclusively keep the location of every net shape of the multitude of net shapes 215-235 on only a different one of the multitude of tracks 202-212. The multitude of net shapes 215-235 may be subdivided into two types of shapes commonly referred to as one dimensional (1D) and two dimensional (2D), so named from definitions in accordance from the perspective of the layout, and not by how many physical dimensions in space are being occupied. For example, net shapes 215, 220, 225, and 235 may be called one dimensional or 1D because each shape includes an outer periphery shaped as a single rectangle and each includes a longitudinal axis that is disposed along one preferential axis, e.g. the x-axis as depicted. In contrast, net shape 230 is more complex than a single rectangle and may be called two dimensional or 2D because net shape 230 includes a section of the shape that extends between tracks and may include sections that are characterized as having a longitudinal axis in two orthogonal directions, and hence characterized as 2D. A 2D shape may usually be subdivided into a multitude of 1D shapes. It is clear that 1D shapes may be entirely constrained to track locations, while 2D shapes may not be entirely constrained to track locations in some portion of the 2D shape.

Figure 3:
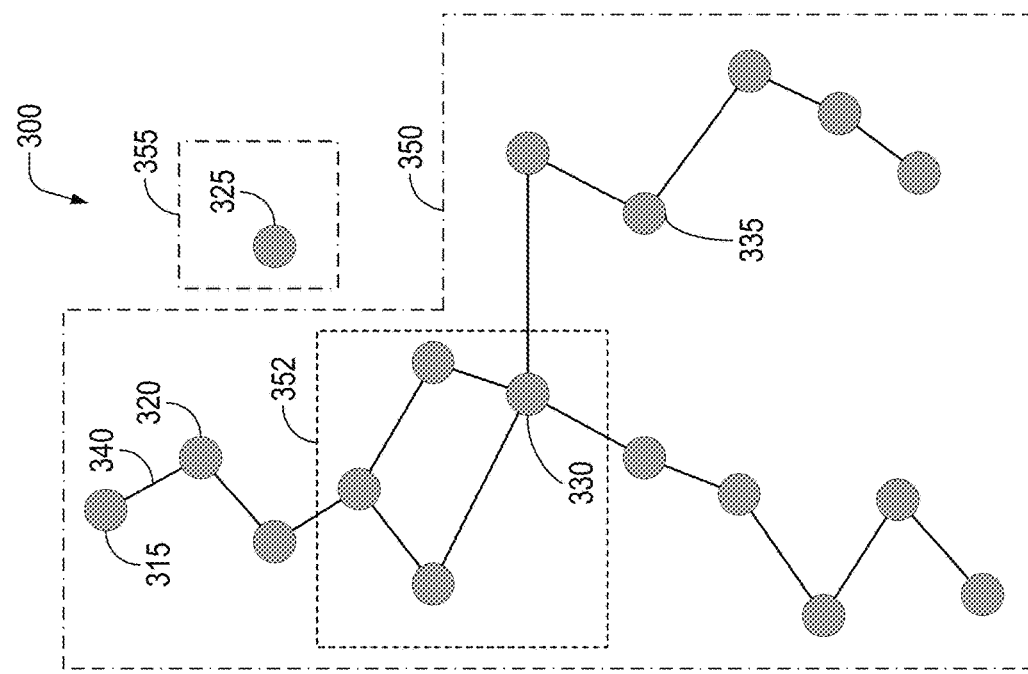
FIG. 3 depicts a simplified graph representing the portion of one signal layer depicted in FIG. 2, in accordance with one embodiment of the present invention.

FIG. 3 depicts a simplified graph 300 representing the portion of one signal layer 200 depicted in FIG. 2, in accordance with one embodiment of the present invention. Referring simultaneously to FIGS. 2-3, simplified graph 300 may include and/or be characterized by a multitude of vertices 315-335, each associated with a different one of the multitude of net shapes 215-235. Simplified graph 300 may further include and/or be characterized by a multitude of edges 340 each joining a pair of the multitude of vertices, e.g. pair of vertices 315, 320, when an immediately adjacent pair of the multitude of net shapes, e.g. pair of net shapes 215, 220, associated with the pair of the multitude of vertices, e.g. pair of vertices 315, 320, are constrained by the spacing constraint of the double patterning layer 240. In other words, multitude of edges 340 is each associated with a different one of the multitude of links 240.

In one embodiment, simplified graph 300 may be divided into a multitude of connected shape sets or groups 350, 355, where each group includes vertices that are either directly or indirectly connected via edges. In this example, two groups are depicted; one group 350 with seventeen vertices and another group 355 with just a single vertex 325.

To be compatible with DPT, simplified graph 300 representative of the design intent should be two-colorable, e.g. decomposable into two colors or masks without any conflicts or design rule violations. Links and/or edges may be characterized as being allowable or conflicting. A conflict link and/or edge, hereinafter also referred to as a "conflict," occurs when any edge of the graph is terminated by two vertices of the same color and may be determined in accordance with the concept of cycles. A cycle is any set of vertices connected by a closed loop of edges. Cycles may be characterized as being even or odd. An even cycle includes an even number of vertices. An odd cycle includes an odd number of vertices and will not be decomposable into two colors because an odd cycle will contain an edge that is a conflict edge. Accordingly, any group that includes no cycles or only even cycles is decomposable into two colors, while any group that includes any odd cycles is not decomposable into two colors.

Another way to determine if a graph and hence its associated shapes are decomposable into two colors is in accordance with the concept of a non-overlapping path, which is a chain of a multitude vertices each connected via a different one of a multitude edges wherein each vertex is disposed only once in the chain. For a graph that is decomposable into two colors it will hold that each different edge in any non-overlapping path of the graph connects vertices having alternating colors, hereinafter called the "alternating color property."

It is understood that conflict links are not to be confused with other types of design rule violations. For example, the spacing corresponding to the conflict link may be allowable per the DPT design rules only if it were not for the issue that the conflict link is between two shapes assigned to the same color.

Group 350 includes an even cycle 352, depicted within the dashed rectangle, and no other cycles and should therefore be two-colorable. Group 355 includes no cycles and should therefore be two-colorable. Accordingly, simplified graph 300 and portion of one signal layer 200 contain no conflicts and are decomposable into two colors or masks. For double-patterning, determining whether a graph is two-colorable may be solved for each group in the graph by a compact, linear time algorithm to determine conflicts.

Figure 4:
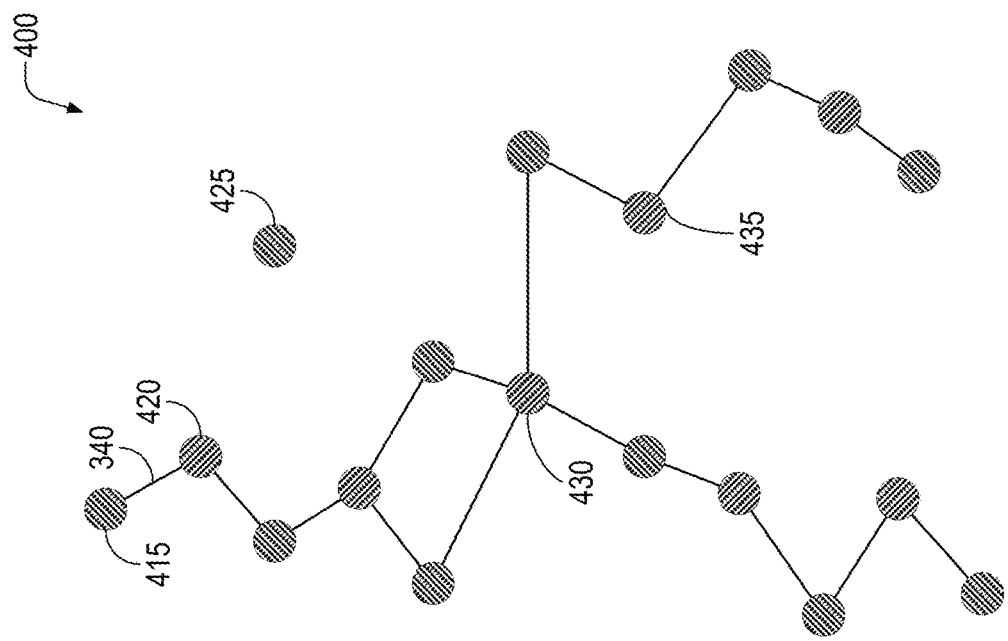
FIG. 4 depicts the simplified graph depicted in FIG. 3 after decomposition into two colors, in accordance with one embodiment of the present invention.

FIG. 4 depicts the simplified graph 400 depicted in FIG. 3 after decomposition into two colors, in accordance with one embodiment of the present invention. Simplified graph 400 includes the same features and function as simplified graph 300 depicted in FIG. 3 except each of the vertices is depicted with one of two fill patterns associated with one of two colors corresponding to mask A, mask B. For example, vertices 415 and 425 may be assigned to color/mask A, while vertices 420, 430, and 435 may be assigned to color/mask B.

Figure 5:
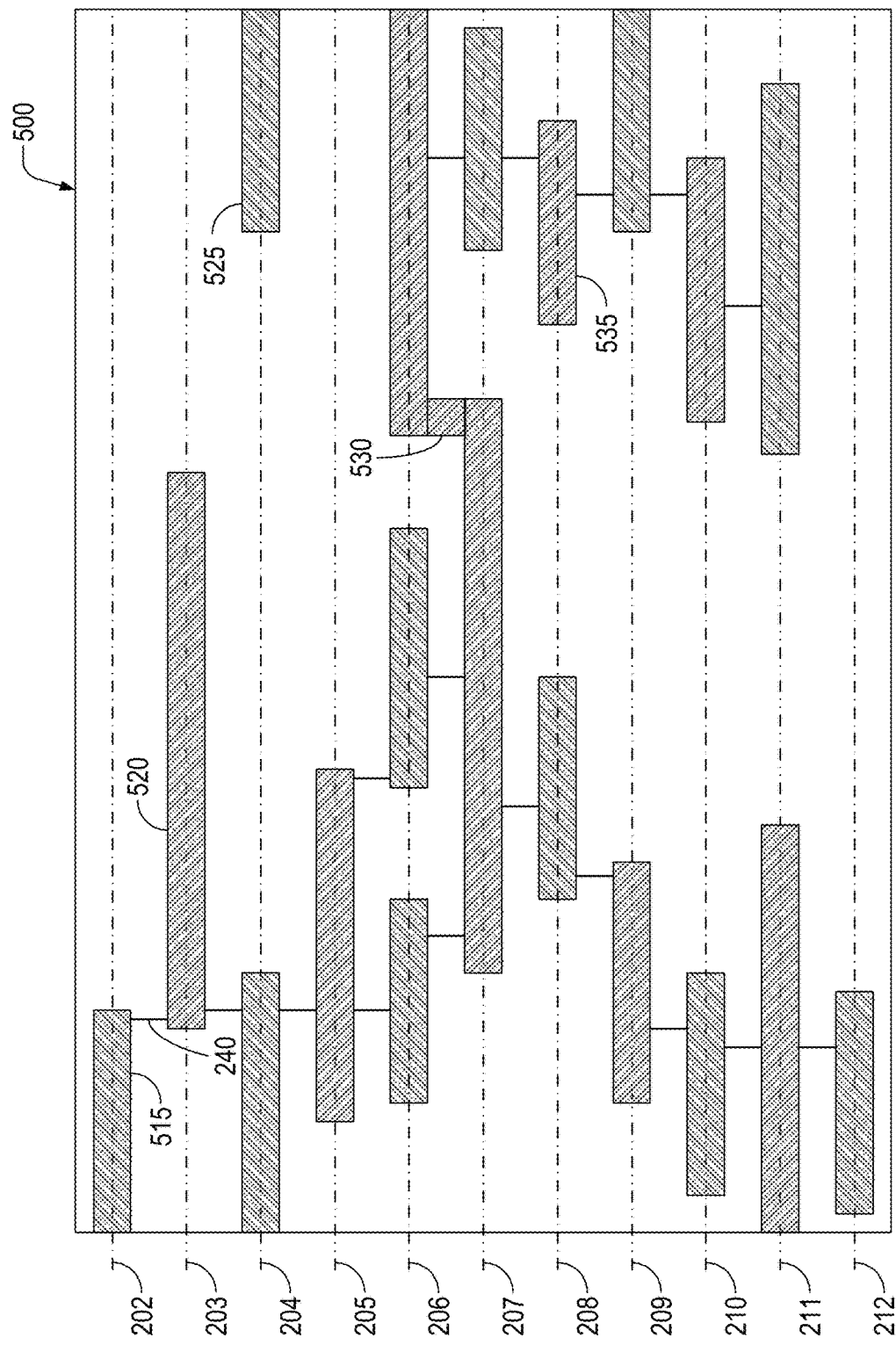
FIG. 5 depicts the portion of one signal layer of the portion of one signal layer depicted in FIG. 2 after decomposition into two colors according to the simplified graph depicted in FIG. 4, in accordance with one embodiment of the present invention.

FIG. 5 depicts the portion of one signal layer 500 of portion of one signal layer 200 depicted in FIG. 2 after decomposition into two colors according to the simplified graph 400 depicted in FIG. 4, in accordance with one embodiment of the present invention. FIG. 5 depicts the same elements and functions as FIG. 2 except each of the multitude of net shapes is now assigned according to the two colors/masks A, B depicted in FIG. 4. For example, multitude of net shapes 515 and 525 may be assigned to color/mask A, while multitude of net shapes 520, 530, and 535 may be assigned to color/mask B. The multitude of links 240 are each terminated by net shapes having opposite colors and no conflict links are present so the multitude of net shapes in portion of one signal layer 500 is two colorable or is decomposable into two colors.

Figure 6:
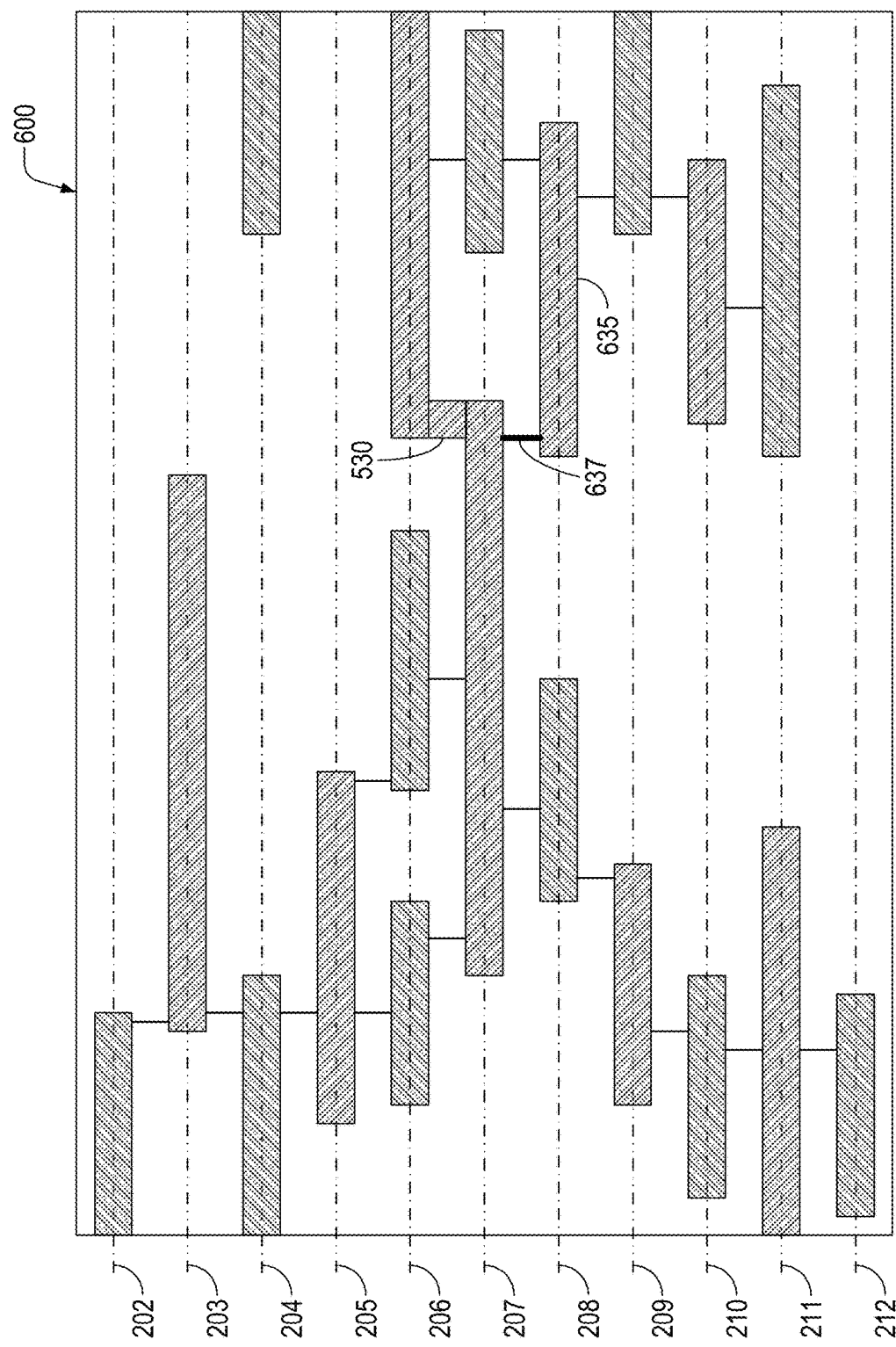
FIG. 6 depicts an example of a portion of one signal layer similar to the portion of one signal layer depicted in FIG. 5 except including a conflict after attempted decomposition into two colors, in accordance with one embodiment of the present invention.

FIG. 6 depicts an example of a portion of one signal layer 600 similar to portion of one signal layer 500 depicted in FIG. 5 except including a conflict 637 after attempted decomposition into two colors, in accordance with one embodiment of the present invention. Referring simultaneously to FIGS. 5-6, FIG. 6 depicts the same elements and functions as depicted in FIG. 5 except net shape 635 extends closer to net shape 530 so as to generate conflict link 637, depicted by a thick line segment. Conflict link 637 is terminated by net shapes 530, 635 that are both assigned to the same color, e.g. color/mask B, and thereby making link 637 a conflict for DPT. Portion of one signal layer 600 is not decomposable into two colors or masks because of the existence of conflict link 637 as will be described with an associated graph below.

Figure 7:
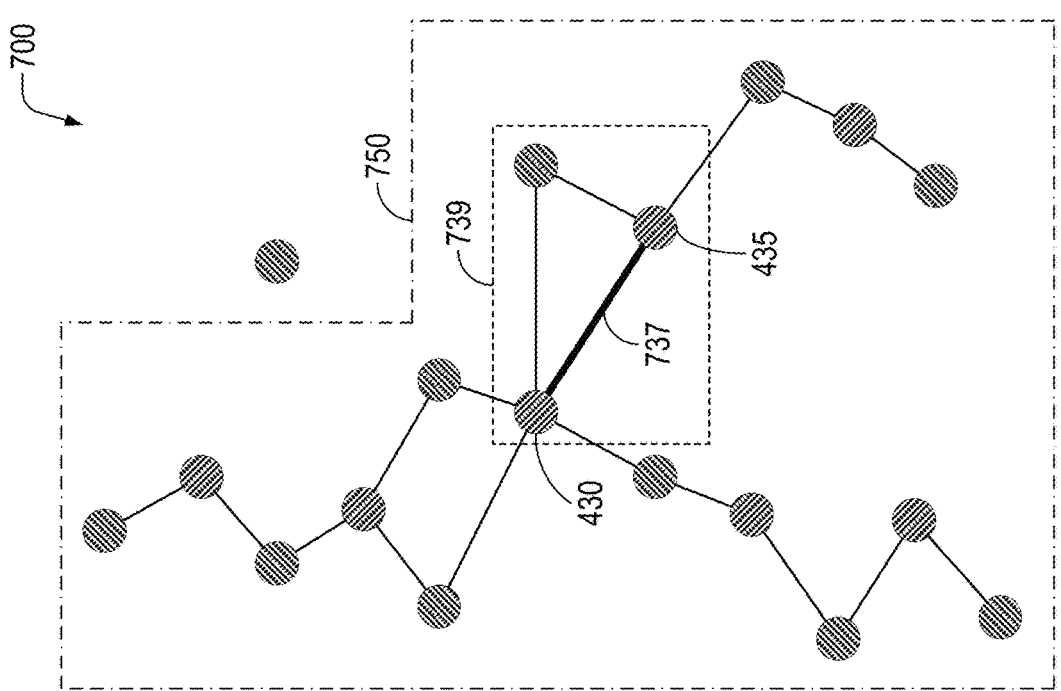
FIG. 7 depicts a simplified graph representing the portion of one signal layer depicted in FIG. 6 after attempted decomposition into two colors, in accordance with one embodiment of the present invention.

FIG. 7 depicts a simplified graph 700 representing the portion of the portion of one signal layer 600 depicted in FIG. 6 after attempted decomposition into two colors, in accordance with one embodiment of the present invention. Simplified graph 700 includes group 750. Referring simultaneously to FIGS. 4, and 6-7, FIG. 7 depicts the same elements and functions as depicted in FIG. 4 except group 750 includes a conflict edge 737 representing conflict link 637, depicted by a thick line segment between vertices 430 and 435. Further, group 750 now includes an odd cycle depicted within dashed line 739, which is not decomposable into two colors/masks no matter how the colors may be assigned.

Figure 8:
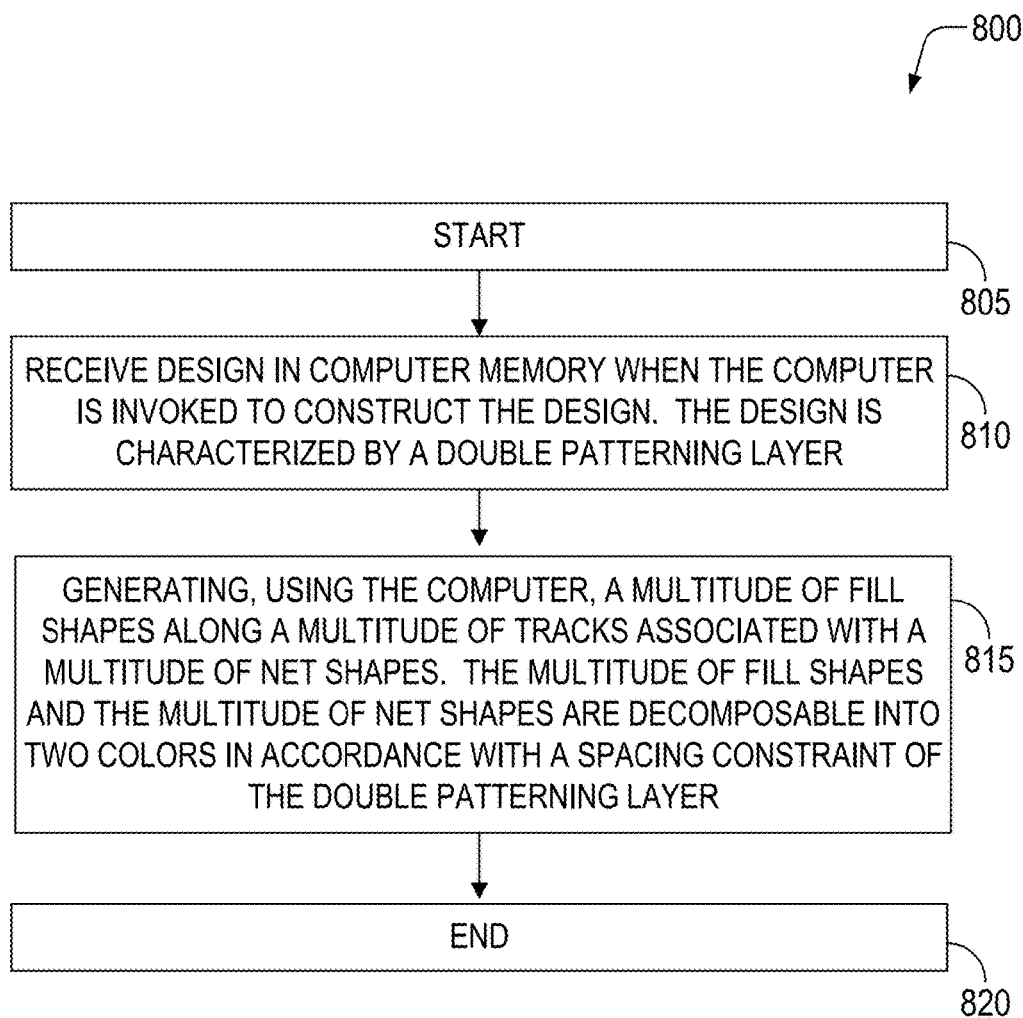
FIG. 8 depicts a simplified flow chart of a technique for constructing a design characterized by a double patterning layer, in accordance with one embodiment of the present invention.

FIG. 8 depicts a simplified flow chart of a technique for constructing a design characterized by a double patterning layer 800, in accordance with one embodiment of the present invention. Referring simultaneously to FIG. 2 and FIG. 8, after starting 805 when the computer is invoked to construct added fill shapes in at least region 345 of the design intent to increase the density of shape per unit of surface area, the computer receives 810 the design intent in computer memory. The design intent may include the portion of one signal layer of design intent 200, which is characterized by being a DPT layer, e.g. requiring two masks to pattern the one signal layer.

The computer may then generate 815 a multitude of new fill shapes (to be described in greater detail below) on or along multitude of tracks 202-212 associated with the multitude of net shapes 215-235. The multitude of fill shapes and multitude of net shapes 215-235 are decomposable into two colors/masks A, B in accordance with the allowable spacing rule of the DPT layer depicted by the multitude of links 240, which is associated with a spacing design rule of the double patterning layer. If there are any conflicts in the design intent 200 they may be corrected before starting the techniques described here.

Figure 9:
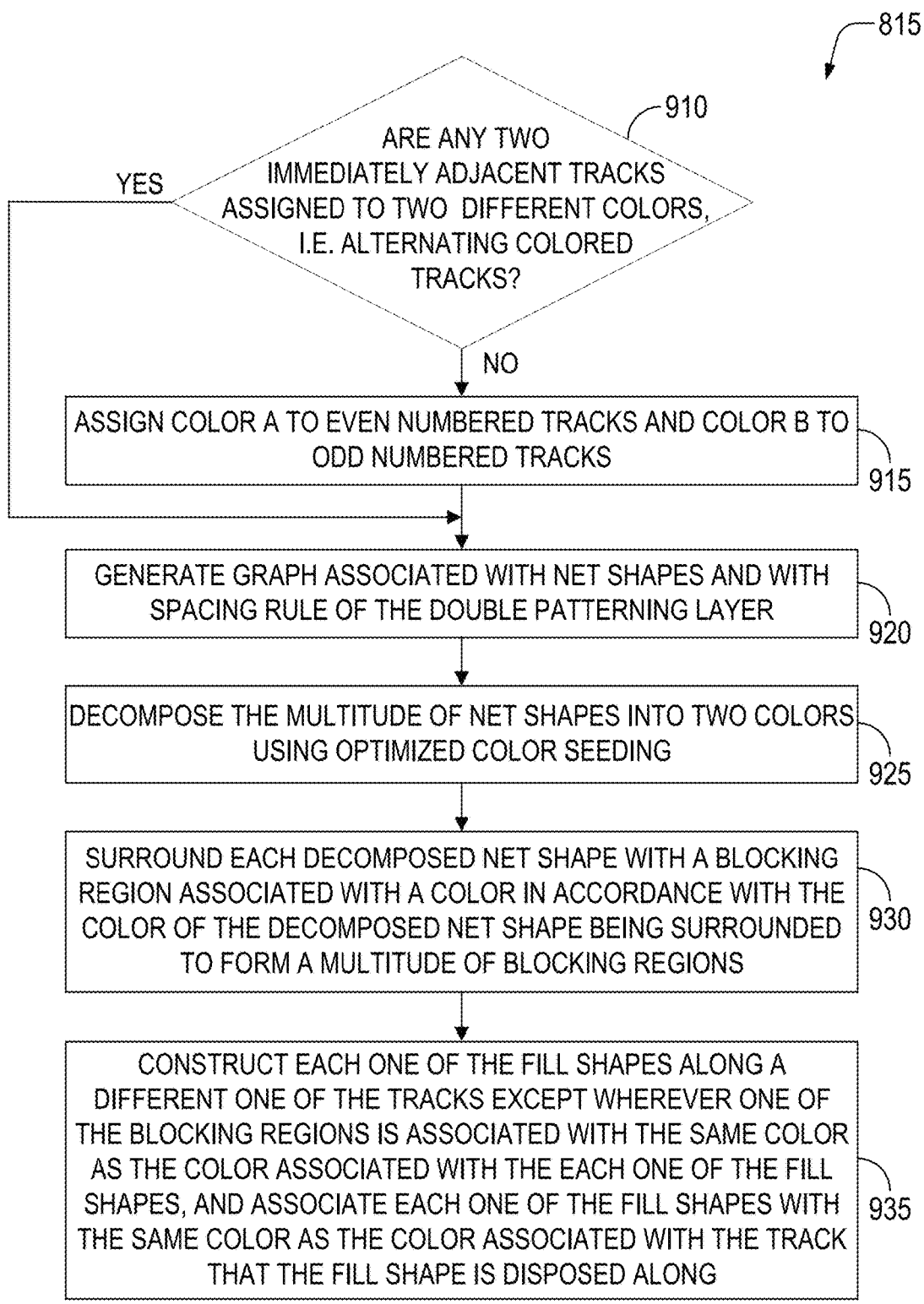
FIG. 9 depicts a simplified flow chart for the step of generating the multitude of fill shapes along the multitude of tracks depicted in FIG. 8, in accordance with one embodiment of the present invention.

FIG. 9 depicts a simplified flow chart 815 for the step of generating the multitude of fill shapes along the multitude of tracks depicted in FIG. 8, in accordance with one embodiment of the present invention. Referring simultaneously to FIG. 2 and FIG. 9, the computer system determines 910 whether or not multitude of tracks 202-212 are already assigned to two alternating colors, i.e. are any two immediately adjacent tracks assigned to two different colors. The multitude of tracks are each sequentially numbered, e.g. tracks 202-212, and include a multitude of even numbered tracks and a multitude of odd numbered tracks. The computer assigns 915 color A to even numbered tracks, e.g. tracks 202, 204, through 210, depicted by dashed/dotted lines, and color B to odd numbered, e.g. tracks 203, 205, through 211, depicted by dashed/double dotted lines, thereby assigning any immediately adjacent tracks of the multitude of tracks to alternating different colors, when immediately adjacent tracks of the multitude of tracks 202-212 are not previously assigned to alternating different colors.

Referring simultaneously to FIG. 3 and FIG. 9, when the multitude of tracks 202-212 are previously assigned to alternating different colors or after the computer assigns alternating colors to the multitude of tracks 202-212, the computer next generates 920 a graph 300 associated with the multitude of net shapes 215-235 and with spacing rule 240 of the double patterning layer.

Figure 10:
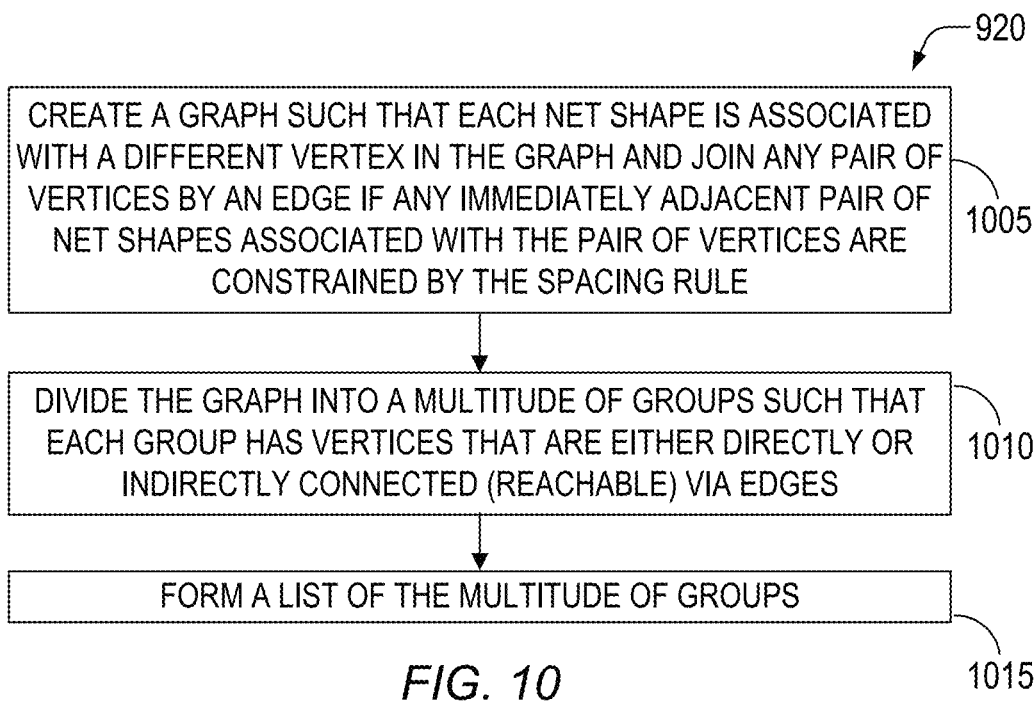
FIG. 10 depicts a simplified flow chart for the step of generating the graph depicted in FIG. 9, in accordance with one embodiment of the present invention.

FIG. 10 depicts a simplified flow chart 920 for the step of generating the graph depicted in FIG. 9, in accordance with one embodiment of the present invention. Referring simultaneously to FIGS. 2, 3 and 10, the computer creates 1005 a graph 300 such that each of the multitude of net shapes 215-235 is associated with a different one of the multitude of vertices 315-335 in graph 300. Further, the computer joins any pair of vertices, e.g. 315, 320, by an edge 340 if any immediately adjacent pair of net shapes, e.g. 215, 220, associated with the pair of vertices 315, 320 are constrained by the spacing rule 240. Then the computer divides 1010 the graph into a multitude of groups 350, 355 such that each group has vertices that are either directly or indirectly connected (reachable) via edges 340. The computer then forms 1015 a list of the multitude of groups 350, 355.

Figure 11:
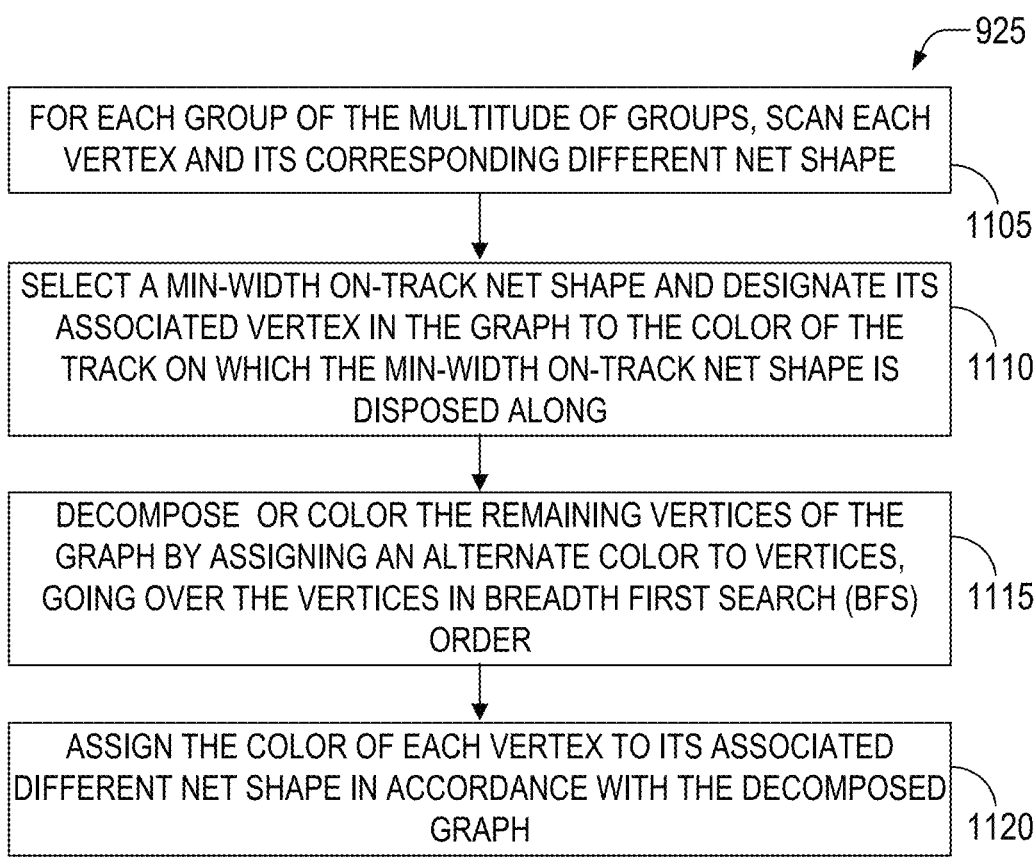
FIG. 11 depicts a simplified flow chart for the step of decomposing the multitude of net shapes into the two colors using optimized color seeding, depicted in FIG. 9, in accordance with one embodiment of the present invention.

Referring again to FIG. 9, the computer next decomposes 925 the multitude of net shapes 215-235 into the two colors using optimized color seeding, which causes the majority of the net shapes to follow the pre-assigned alternating track colors. FIG. 11 depicts a simplified flow chart 925 for the step of decomposing the multitude of net shapes 215-235 into the two colors using optimized color seeding, depicted in FIG. 9, in accordance with one embodiment of the present invention. Referring simultaneously to FIGS. 3, 4, and 11, for each group of the multitude of groups 350, 355, the computer scans 1105 each one of the multitude of vertices 315-335 and its corresponding different net shape of the multitude of net shapes 215-235.

The computer next selects 1110, in accordance with a minimum width constraint W of the double patterning layer, an on-track net shape, e.g. selected net shape 215, and designates one of the multitude of vertices 315-335, e.g. designated vertex 315, associated with selected net shape 215 in graph 300 to the color, e.g. color A, of track 202 upon which the minimum-width on-track net shape 215 is disposed along. The computer next decomposes or colors 1115 the remaining vertices of the multitude of vertices 415-435 in graph 400 by assigning an alternating different color to any immediately adjacent vertices in accordance with designated vertex 415, going over the vertices in breadth first search (BFS) order.

BFS visits the vertices in the graph in such a way that given a starting vertex N, then immediate neighbors of vertex N are visited first, followed by the neighbors of the first visited neighbor vertices and so on. In breadth first search, vertices in the graph are visited in following way. Start with a vertex N and put it in Queue Q. Consider the first vertex N in the queue. Mark it visited. Add the neighbors of N at the back of the queue. Mark the neighbors visited. If a neighbor is already visited before, ignore it. Remove N from the queue and repeat considering each vertex until the queue is empty. Referring simultaneously to FIGS. 4, 5, and 11, The computer next assigns 1120 the color of each vertex of the multitude of vertices 415-435 to its associated different net shape of the multitude of net shapes 515-535 in accordance with the decomposed graph 400.

Figure 12:
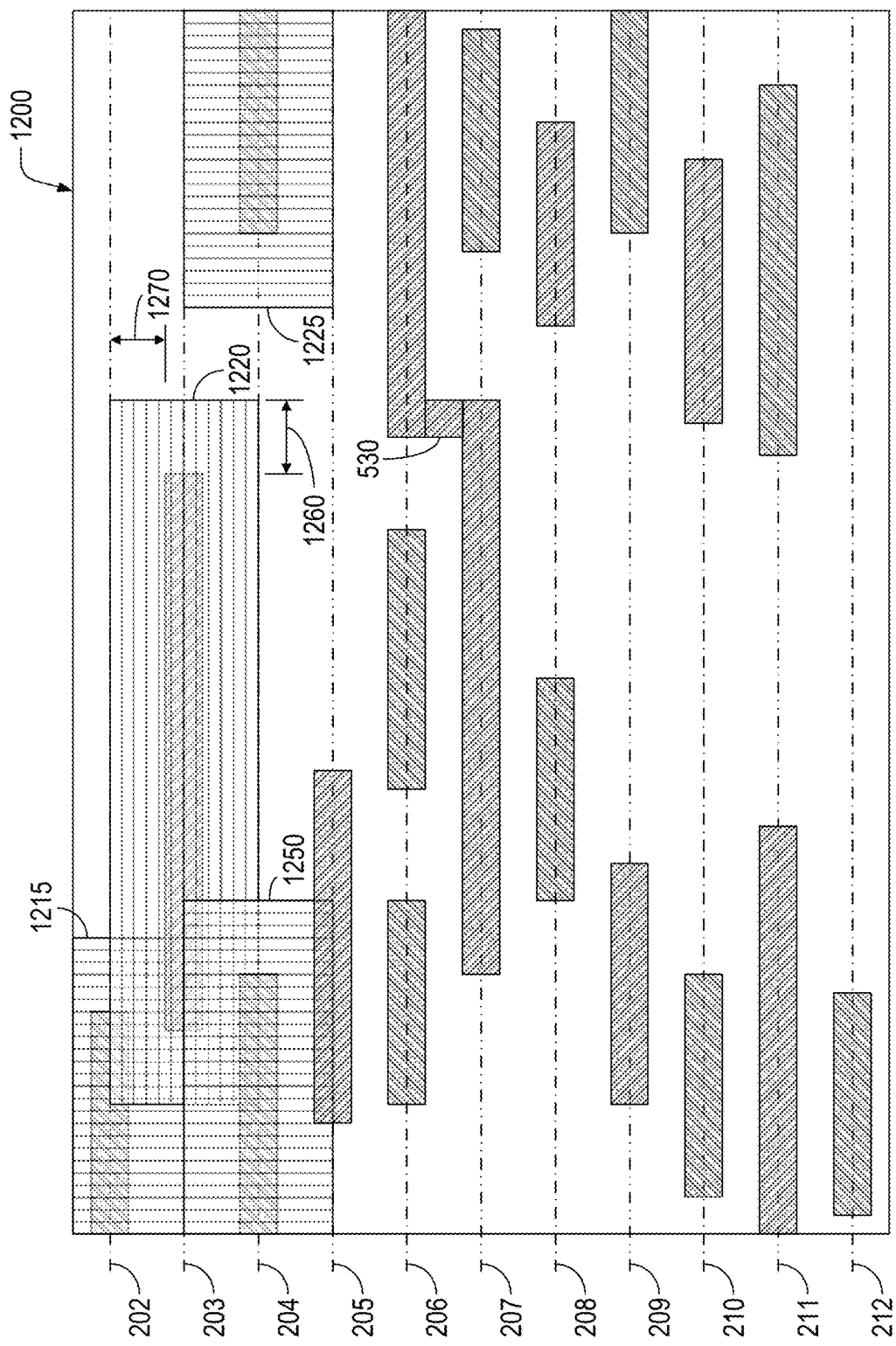
FIG. 12 depicts the portion of one signal layer of the portion of one signal layer depicted in FIG. 5 after surrounding a few of the decomposed net shapes with blocking regions, in accordance with one embodiment of the present invention.

FIG. 12 depicts the portion of one signal layer 1200 of the design intent depicted in FIG. 5 after surrounding a few of the decomposed net shapes with blocking regions, in accordance with one embodiment of the present invention. Portion of one signal layer 1200 depicts the same elements and functions as FIG. 5, with the following exceptions. Portion of one signal layer 1200 includes a multitude of blocking regions 1215, 1220, 1225, and 1250 that are added by the computer as described below.

Referring again to FIG. 9, the computer next surrounds 930 each decomposed net shape with a blocking region associated with a color of the two colors that corresponds to the color of the decomposed net shape to form a multitude of blocking regions. Referring simultaneously to FIGS. 5 and 12, multitude of blocking regions 1215, 1225, are associated with color A, the same color associated with the corresponding net shapes 515, 525 respectively being surrounded. Blocking regions 1220 is associated with color B, the same color associated with the corresponding net shape 525 being surrounded by blocking region 1220. In one embodiment, the longitudinal axis of each of the multitude of blocking regions is disposed substantially on the longitudinal axis of the net shape that is being surrounded.

Figure 13:
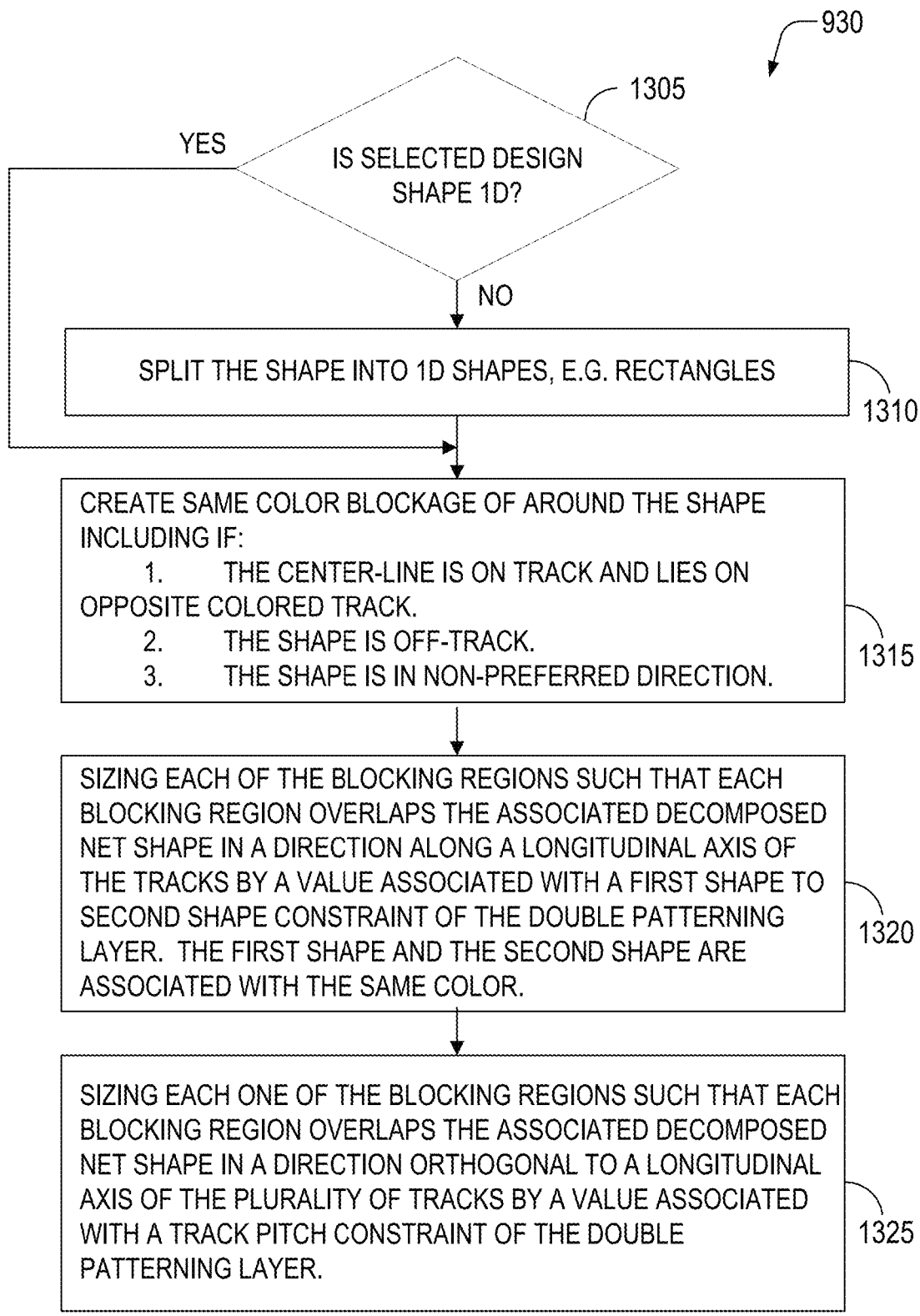
FIG. 13 depicts a simplified flow chart for the step of surrounding each decomposed net shape with a blocking region, depicted in FIG. 9, in accordance with one embodiment of the present invention.

FIG. 13 depicts a simplified flow chart 930 for the step of surrounding each decomposed net shape with a blocking region, depicted in FIG. 9, in accordance with one embodiment of the present invention. Referring simultaneously to FIGS. 12 and 13, the system determines 1305 if the selected net shape is 1D and if not 1D, splits 1310 the shape into 1D shapes such as depicted for net shape 530, which is a 2D shape originally but is depicted as including three 1D shapes. The three 1D shape in net shape 530 include: a 1D shape disposed along track 206, a 1D shape disposed along track 207, and a short 1D net shape disposed therebetween, that joins the former two net shapes.

After the selected shape is determined to be 1D, the system creates the blocking regions such as blocking regions 1215-1225 described above. Blocking regions are also generated if the shape being surrounded include a centerline that lies along a track, i.e. is on-track, assigned to an color opposite of the color of the track, such as for example the portion of shape 530 of color B that lies along track 206, which is assigned to color A. Blocking regions are also generated if the selected shape that does not lay along a track, i.e. is off-track, such as for example the 1D shape that joins the other two 1D shapes forming net shape 530 and if the selected net shape is disposed in a non-preferred direction.

The system sizes 1320 each of the blocking regions 1215-1225 such that each blocking region overlaps the associated decomposed net shape in a direction along a longitudinal axis of the tracks, e.g. x-axis as depicted, by a value 1260 associated with a minimum first shape to second shape constraint of the double patterning layer, where the first shape and the second shape are associated with the same color. In one embodiment, value 1260 first shape to second shape constraint of the double patterning layer for shapes on the same track may have a value greater than the spacing constraint of the double patterning layer for shapes between immediately adjacent tracks. Value 1260 ensures that each of the blocking regions will prevent generation of new links between a net shape and fill shape disposed on the same track, which will be added along the same track as the selected net shape as described below.

The system sizes 1325 each one of the blocking regions 1215-1225 such that each blocking region overlaps the associated decomposed net shape in a direction orthogonal to a longitudinal axis of the multitude of tracks, e.g. y-axis as depicted, by a value 1270 associated with a track pitch constraint T of the double patterning layer. In one embodiment, the overlap value 1270 may be equal to T−(W/2) as depicted, such that the borders of the blocking regions parallel to the direction along the longitudinal axis of the tracks, e.g. x-axis as depicted, are coincident with the immediately adjacent track centerlines. In another embodiment, the overlap value 1270 may be equal to the spacing constraint of the double patterning layer (not shown).

Figure 14:
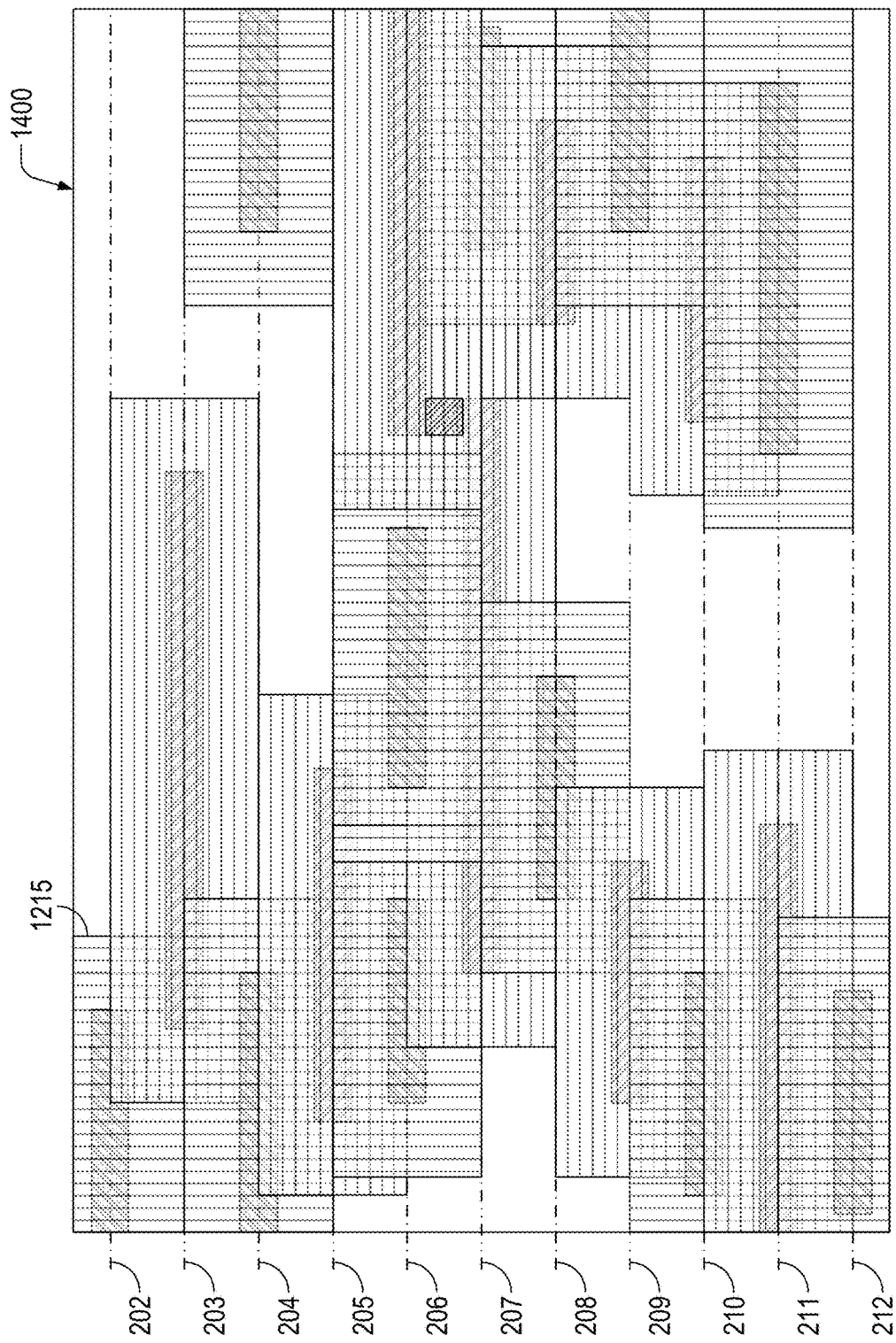
FIG. 14 depicts the portion of one signal layer of the portion of one signal layer depicted in FIG. 12 after surrounding the decomposed net shapes with blocking regions, in accordance with one embodiment of the present invention.

FIG. 14 depicts the portion of one signal layer 1400 of the design intent depicted in FIG. 12 after surrounding the decomposed net shapes with blocking regions, in accordance with one embodiment of the present invention. Portion of one signal layer 1400 includes the same elements and functions as portion of one signal layer 1200, with the following exceptions. The multitude of blocking regions associated with color A are depicted with a vertically oriented fill code, while the multitude of blocking regions associated with color B are depicted with a horizontally oriented fill code.

Figure 15:
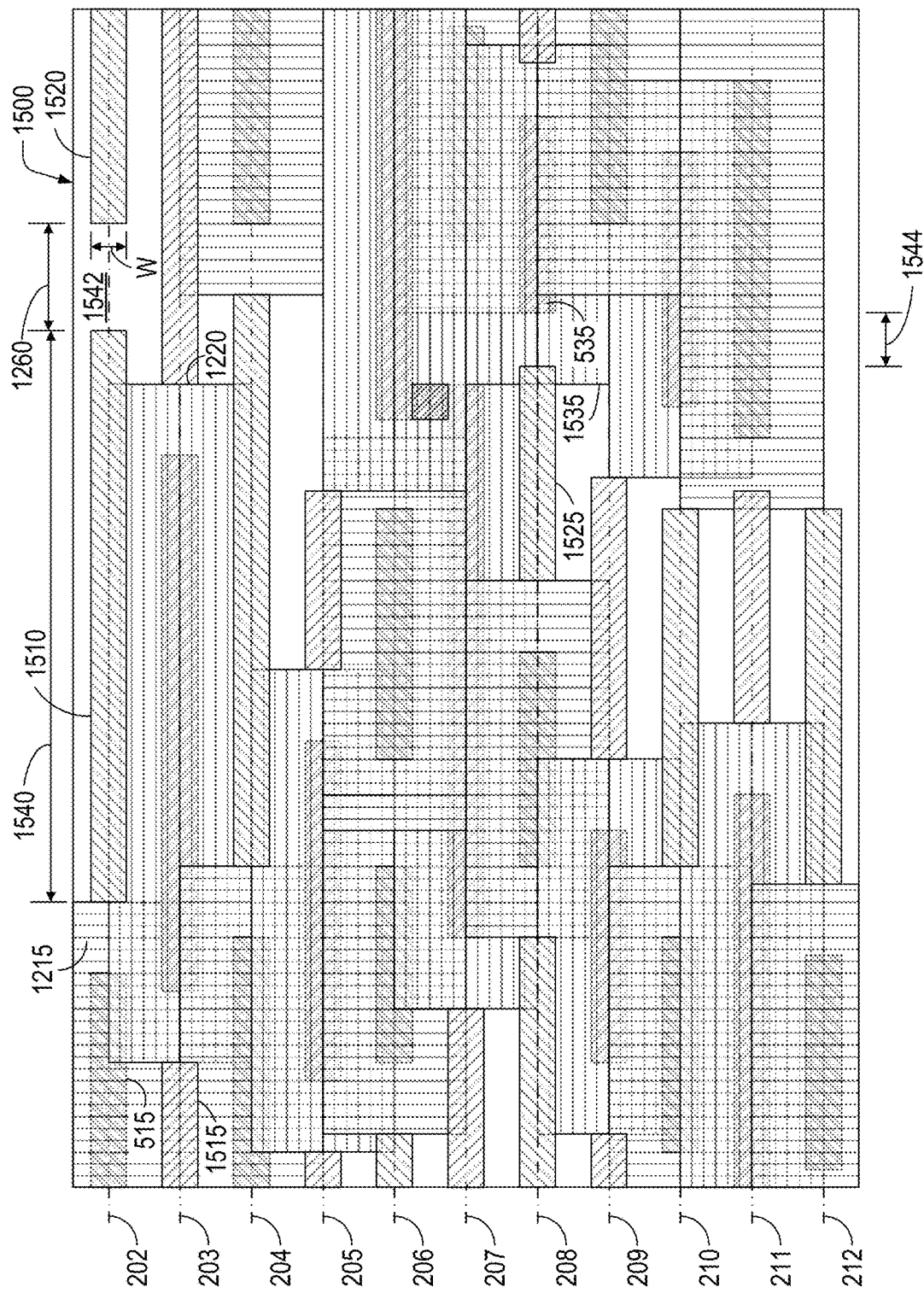
FIG. 15 depicts a portion of one signal layer of the portion of one signal layer depicted in FIG. 14 after constructing the multitude of fill shapes in accordance with the multitude of blocking regions, in accordance with one embodiment of the present invention.

FIG. 15 depicts portion of one signal layer 1500 of portion of one signal layer 1400 depicted in FIG. 14 after constructing the multitude of fill shapes 1510-1525 in accordance with the multitude of blocking regions, in accordance with one embodiment of the present invention. Portion of one signal layer 1500 includes the same elements and functions as portion of one signal layer 1400, with the following exceptions. Referring simultaneously to FIGS. 9 and 15, the system next constructs 935 each one of the multitude of fill shapes 1510-1525 along a different one of the multitude of tracks 202-212 except wherever one of the multitude of blocking regions is associated with the same color as the color associated with the each one of the multitude of fill shapes 1510-1525. The system further associates each one of the multitude of fill shapes 1510-1525 with the same color as the color associated with the track of the multitude of tracks 202-212 that the fill shape is disposed along. In other words, the system constructs fill shapes on the multitude of tracks such that the color of each fill shape corresponds to the color of the track receiving the fill shape, while concurrently avoiding color blockage regions of the same color and maintaining the minimum double patterning spacing rule between adjacent fill shapes on the same track.

For example, the system constructs fill shape 1510 disposed along track 202 except wherever blocking region 1215 is disposed. Blocking region 1215 is associated with color A, the same color as the color associated with fill shape 1510. The system further associates fill shape 1510 with the same color A as the color associated with track 202 that fill shape 1510 is disposed along. Similarly, the system constructs fill shape 1515 disposed along track 203 except wherever blocking region 1220 is disposed. Blocking region 1220 is associated with color B, the same color as the color associated with fill shape 1515. The system further associates fill shapes 1515 with the same color B as the color associated with track 203 that fill shape 1515 is disposed along. Note that blocking regions of color unlike the color of the fill shape have no effect, such as blocking region 1220 and fill shape 1510, which have colors B and A respectively.

In one embodiment, the construction of multitude of fill shapes 1510-1525 will abide by other double patterning design constraints, such as maximum length of shape of the double patterning layer, minimum spacing of color A shape to color B shape along the same track, and minimum width of shape of the double patterning layer. For example, fill shape 1510 may have a length 1540 equal to the maximum length of shape of the double patterning layer, so that fill shape 1510 will accordingly be interrupted by a gap 1542 of value 1260 associated with a minimum fill shape 1510 to fill shape 1520 constraint of the double patterning layer, where fill shape 1510 and fill shape 1520 are associated with the same color A and are both disposed on the same track 202.

For another example, fill shape 1525 of color A may be spaced away from net shape 535 by a minimum spacing 1544 equal to the minimum spacing of color A shape to color B shape along the same track of the double patterning layer. Note that fill shape 1525 is not constrained by blocking region 1535, which is associated with the opposite color B but may instead be constrained by spacing 1544 along track 208. In one embodiment, the width of each of the multitude of fill shapes is set to the width W equal to the minimum width of a shape of the double patterning layer along a direction orthogonal to the longitudinal axis of the multitude of tracks.

Figure 16:
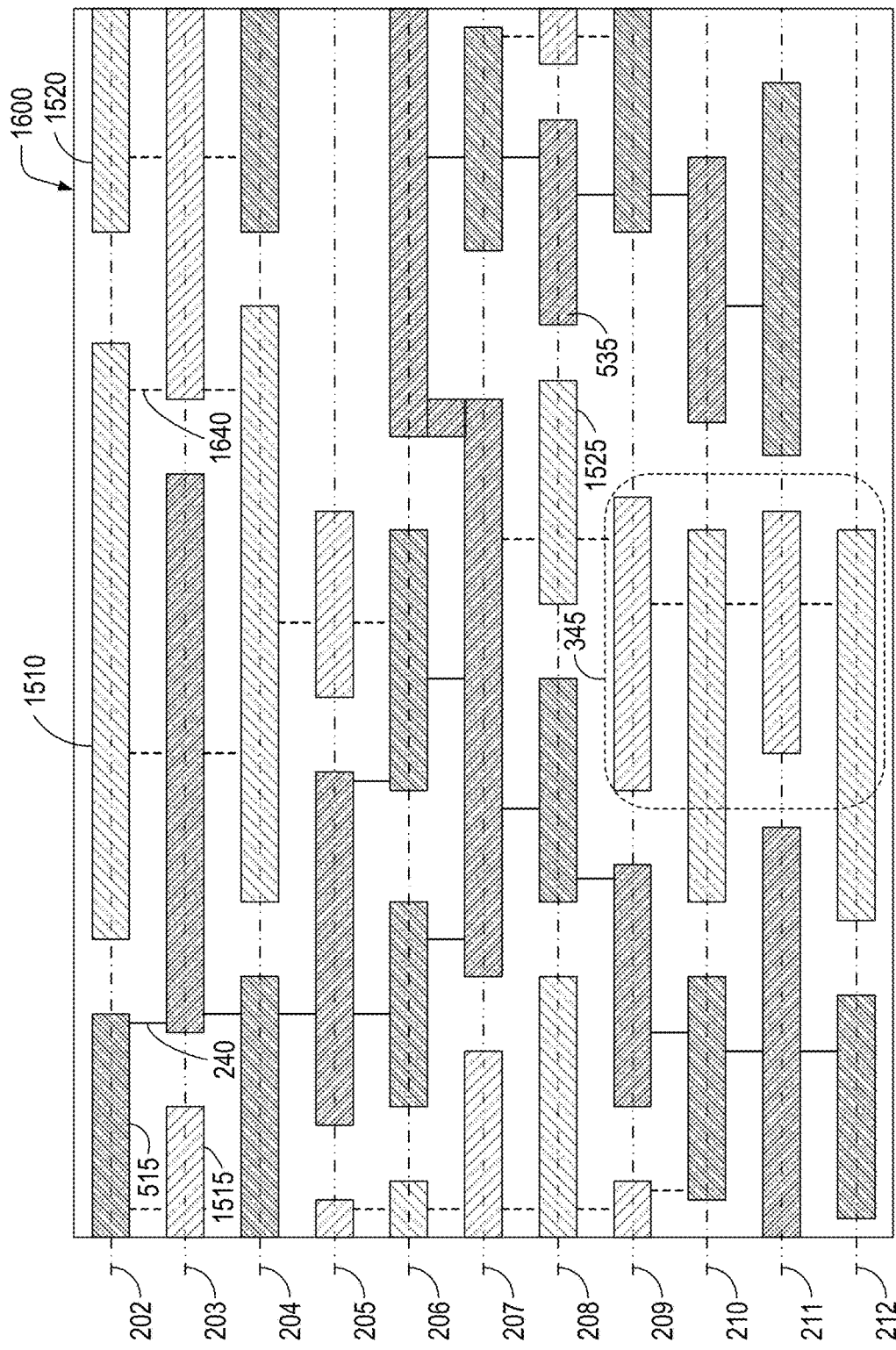
FIG. 16 depicts portion of one signal layer of portion of one signal layer depicted in FIG. 15 after removing the multitude of blocking regions, in accordance with one embodiment of the present invention.

FIG. 16 depicts portion of one signal layer 1600 of portion of one signal layer 1500 depicted in FIG. 15 after removing the multitude of blocking regions 1215-1225, in accordance with one embodiment of the present invention. Design intent 1600 includes the same elements and functions as portion of one signal layer 1500, with the following exceptions. Blocking regions 1215-1225 have been removed to better depict how design intent 1600 includes multitude of net shapes 515, 535, multitude of fill shapes 1510-1525, multitude of net shape links 240 depicted as solid lines, and multitude of fill shape links 1640 depicted as dashed lines. Fill shape links 1640 may include links between fill shapes and/or between a fill shape and a net shape.

It is noted that the embodiments have resulted in the creation of a new multitude of fill shape links 1640 across shapes disposed on immediately adjacent tracks and not between shapes disposed on the same track because: i) the blocking regions were sized in order to prevent the formation of new links between any pair of shapes, fill shapes and/or net shapes in any combination along the same track, and ii) the original multitude of links 240 between the multitude of net shapes included no links between any pair of shapes along the same track.

It is further noted that multitude of fill shapes 1510-1525 have substantial increased the density of shape per unit of surface area in region 345 and other regions as desired, where previously there was only relatively low density of shape per unit of surface area. It is further noted that multitude of net shapes 515, 535 and multitude of fill shapes 1510-1525 are two colorable and no conflict links are generated by the addition of fill shapes 1510-1525 as described below. Further, the density of shape per unit of surface area is balanced between color A and color B, which is desirable in some double patterning processes. Color imbalance between color A and color B measured on typical chips of less than +−2% has usually been achieved according to the embodiments described herein.

Because: i) the multitude of tracks are assigned alternating colors, ii) each of the newly added multitude of fill shapes is assigned the color of the track upon which it is disposed along, and iii) there are no links received in the original design intent nor created by the newly added fill shapes across any pair of shapes disposed along the same track, accordingly, it is expected that per the alternating color property of any non-overlapping path in the graph associated with portion of one signal layer 1600 should be decomposable into two colors without conflicts.

Figure 17:
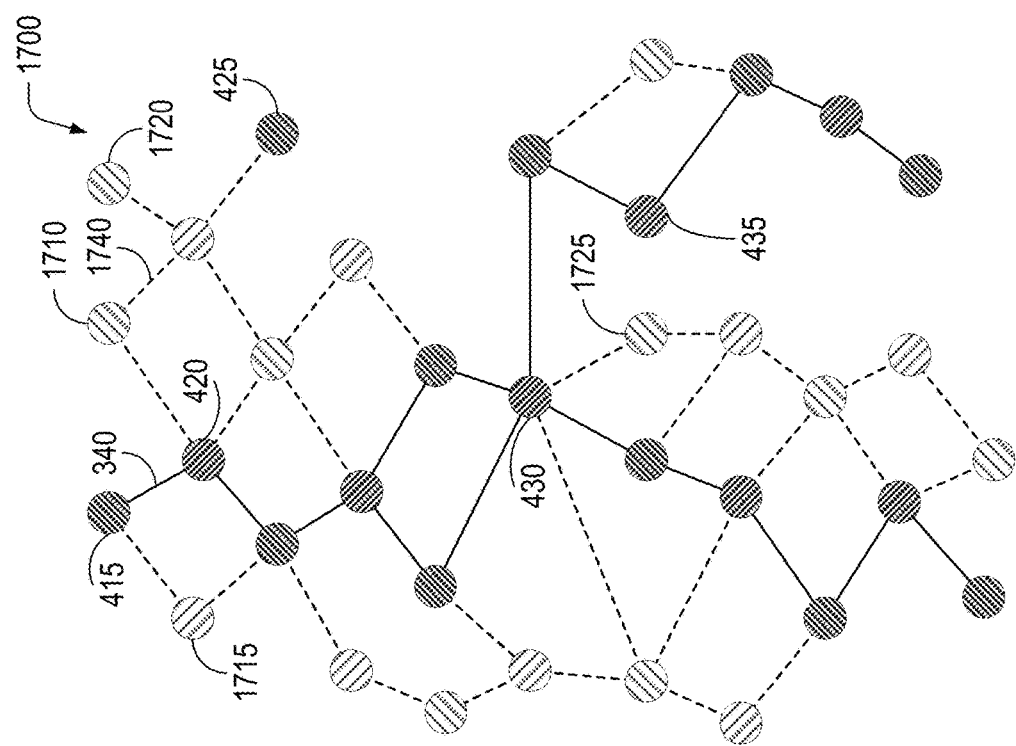
FIG. 17 depicts a simplified graph representing the portion of one signal layer depicted in FIG. 16, in accordance with one embodiment of the present invention.

FIG. 17 depicts a simplified graph 1700 representing the portion of one signal layer 1600 depicted in FIG. 16, in accordance with one embodiment of the present invention. Referring simultaneously to FIGS. 4, 16, and 17, graph 1700 includes the same features and functions as graph 400 depicted in FIG. 4, with the following exceptions. Graph 1700 includes a multitude of edges 1740 associated with multitude of links 1640 depicted as dashed lines and a multitude of vertices 1710-1725 associated with multitude of fill shapes 1510-1525 respectively. Multitude of vertices 1710-1725 are depicted with less dense fill than the fill for vertices 414-435 associated with net shapes. Vertices 1710, 1720, 1725 are associated with color A that is assigned to even numbered tracks, while vertex 1715 is associated with color B that is assigned to odd numbered tracks.

It is noted that graph 1700 includes only even cycles and that there are no odd cycles present in graph 1700. Further, any non-overlapping path in the graph adheres to the alternating color property. Therefore graph 1700 and the associated portion of one signal layer 1600 are decomposable into two colors as desired without coloring conflicts.

Figure 18A:
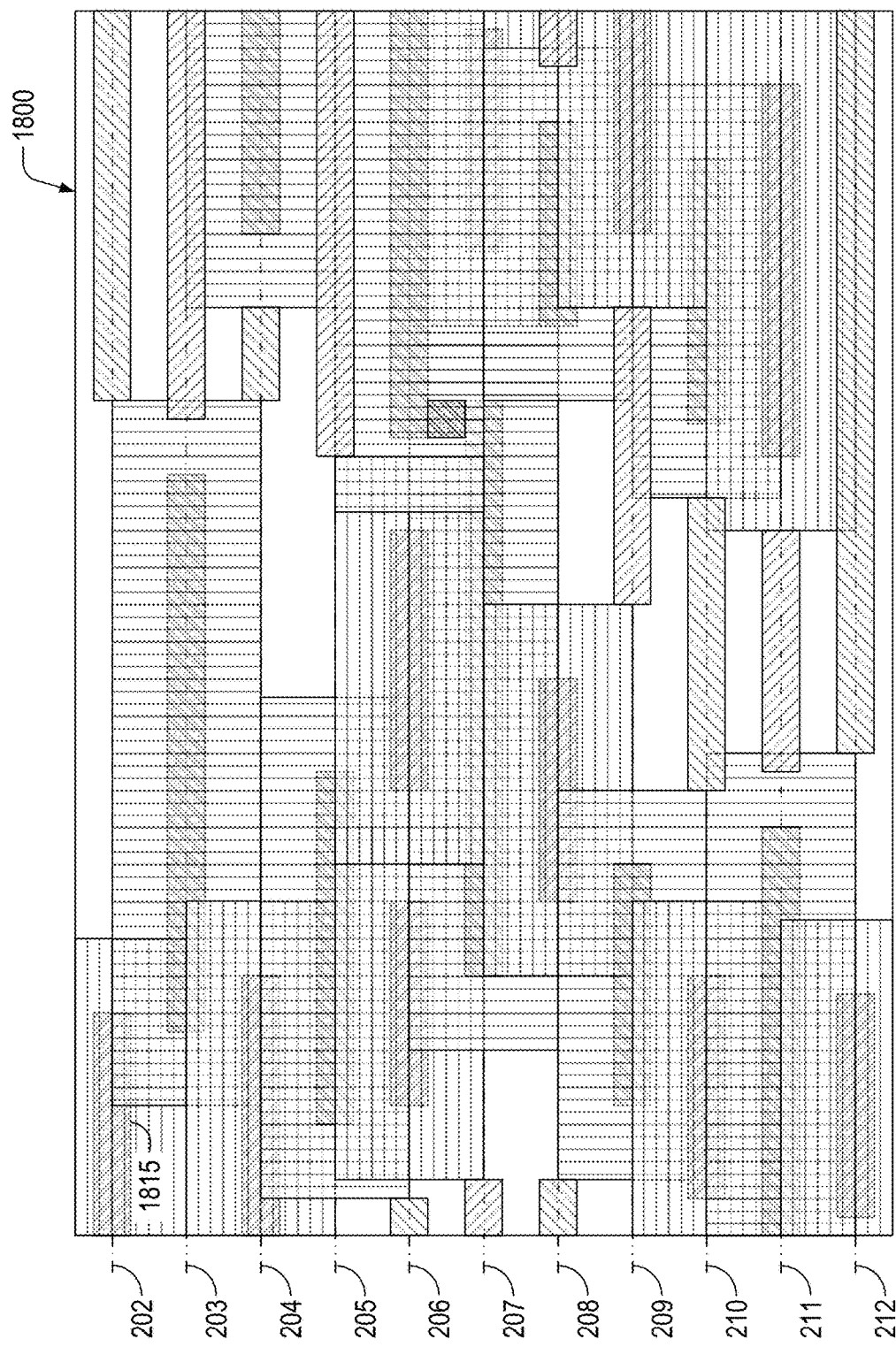
FIG. 18A depicts portion of one signal layer of portion of one signal layer depicted in FIG. 2 after decomposing colors without color seeding, in accordance with one embodiment of the present invention.

FIG. 18A depicts portion of one signal layer 1800 of portion of one signal layer 200 depicted in FIG. 2 after decomposing colors without color seeding, in accordance with one embodiment of the present invention. Portion of one signal layer 1800 includes the same elements and functions of portion of one signal layer 200 depicted in FIG. 2 with the following exceptions. Referring simultaneously to FIGS. 2, 3, and 18A, if the associated graph 300 is colored without color seeding, i.e. step 1110 depicted in FIG. 11 is skipped or omitted, then the added fill shapes and associated graph may still be successfully decomposed into two colors but with less density of shape per unit of surface area than when the color seeding embodiment is applied as will be shown below.

For example, the color decomposition algorithm may choose the color assignment at random such that the color choice for the initial vertex to be assigned a color in the graph is not associated with the color of the track upon which the associated shape is disposed along. Continuing the same example, suppose vertex 315 is initially assigned color B as depicted for net shape 1815, which is opposite to the color A assigned to track 202 along which net shape 215 is disposed. Then the remainder of the vertices may be decomposed into two colors according to the initial assignment of vertex 315 being assigned to color B. In accordance with steps 810, 910-935, 1005-1015, 1105, 1115-1120, 1305-1325 depicted in FIGS. 8-11, and 13, i.e. performing all the embodiments described above but omitting step 1110, provides the color decomposition depicted in FIG. 18A. The color decomposition depicted in FIG. 18 for each of the multitude of net shapes and each of the associated different blocking regions is opposite in color to the color decomposition depicted in FIG. 14 where step 1110 was included.

Figure 18B:
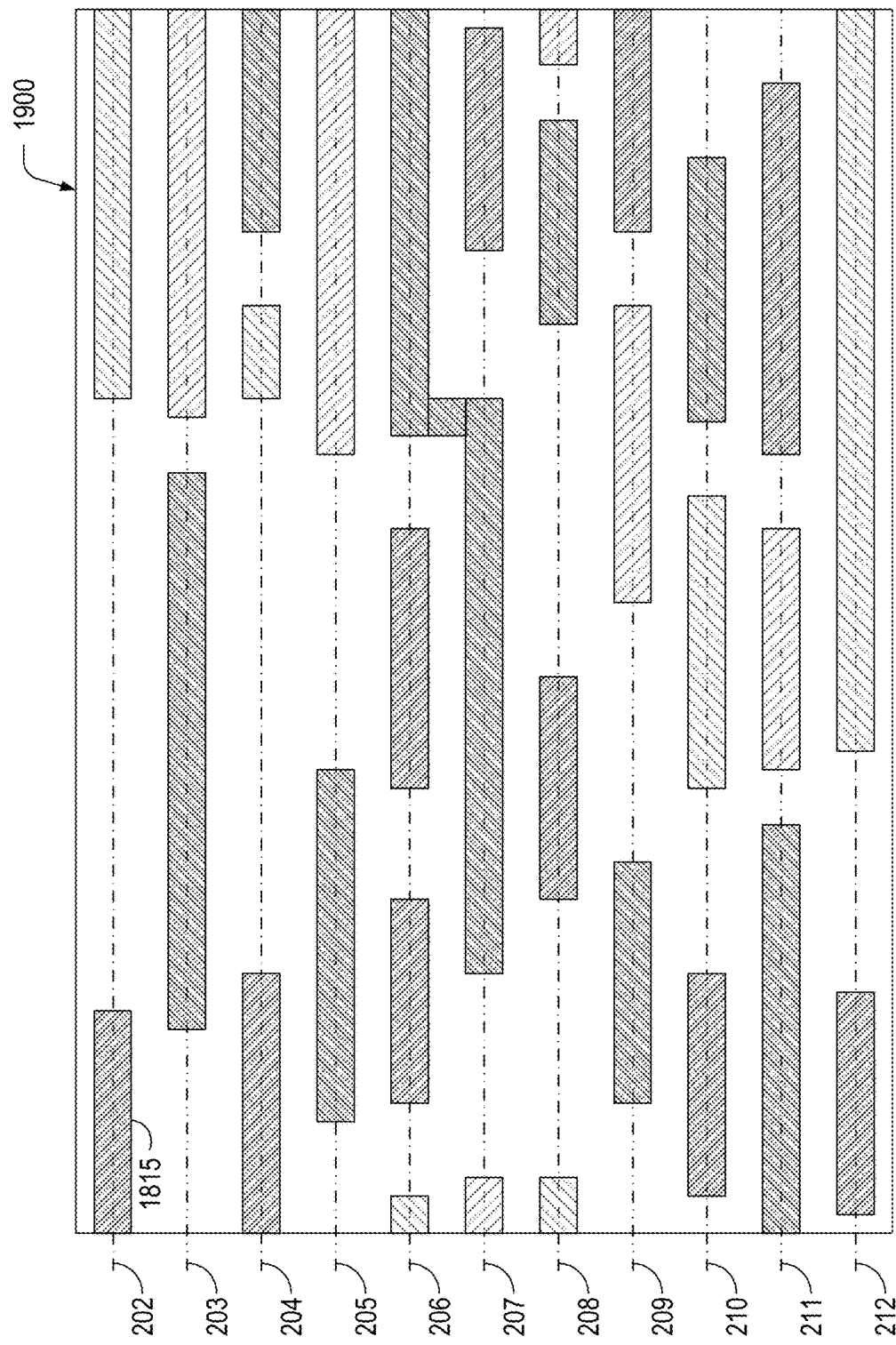
FIG. 18B depicts portion of one signal layer of portion of one signal layer depicted in FIG. 18A after removing the multitude of blocking regions, in accordance with one embodiment of the present invention.

FIG. 18B depicts portion of one signal layer 1900 of portion of one signal layer 1800 depicted in FIG. 18A after removing the multitude of blocking regions, in accordance with one embodiment of the present invention. Because blocking regions depicted in FIG. 18A tended to block adjacent tracks, the resulting multitude of fill shapes in FIG.

18B have less density of shape per unit of surface area than when the color seeding embodiment is applied such as depicted in FIG. 16.

FIG. 19 depicts a series of exemplary process cross sections of one double patterning process that may implement the features, aspects, and steps of the methods discussed herein. FIG. 19 is merely illustrative of an embodiment incorporating the present invention and does not limit the scope of the invention as recited in the claims. One of ordinary skill in the art would recognize other variations, modifications, and alternatives.

The embodiments of FIG. 19 are described in U.S. Pat. No. 8,701,056 B1, filed on Sep. 26, 2012, entitled "AUTOMATED REPAIR METHOD AND SYSTEM FOR DOUBLE PATTERNING CONFLICTS" by Paul David Friedberg, et al. and are repeated in part herein. The resolution of a photolithographic pattern transfer process reaches its limit at approximately 40 nm half-pitch. To address this problem, a technique called double patterning can be used to achieve necessary feature density below 40 nm half-pitch. Double patterning is a technique that uses a double exposure using photoresist to create a pattern in a target layer. For example, FIG. 19A illustrates a first photoresist layer 103 formed on a hard mask layer 102, which in turn is formed on a target (e.g. semiconductor) layer 101, all of which is formed on a substrate 100. In a first exposure, photoresist layer 103 is exposed to a first exposure pattern, which results in a patterned photoresist layer 103P shown in FIG. 19B. In one embodiment, this pattern has a 128 nm pitch, as shown. This first exposure is followed by a first etch into hard mask layer 102, which forms a patterned hard mask layer 102P shown in FIG. 19C. At this point, a second photoresist layer 104 is formed over patterned hard mask layer 102P as shown in FIG. 19D. In a second exposure, photoresist layer 104 is exposed to a second exposure pattern, which results in a patterned photoresist layer 104P shown in FIG. 19E. Note that this pattern also has the same pitch as the first pattern, e.g. 128 nm. This second exposure is followed by a second etch, this time into target layer 101, which forms a patterned target layer 101P 35 shown in FIG. 19F. FIG. 19G shows patterned target layer 101P after removal of the patterned hard mask layer 102P and patterned photoresist layer 104P. Notably, the pitch of patterned target layer 101P is significantly smaller than that of the previous photoresist patterns. In one embodiment, the pitch of patterned target layer 101P is 64 nm.

As shown by FIGS. 19A-19G, using double patterning can allow the manufacture of minimum pitch features that are one half the pitch achievable in present technology not using DPT. Therefore, double patterning is highly desirable to increase feature density in semiconductors. To create patterns 103P and 104P referenced in FIGS. 19A and 19D, each exposure requires a different photomask or mask. In one embodiment the features of photoresist layers 103P, 104P described in U.S. Pat. No. 8,701,056 B1 may be associated respectively with color A, and color B as described herein.

The processing of patterned target layer 101P (FIG. 19F) may be made possible, in-part, because of the improvements in manufacturing provided by the fill shape generation embodiments of the present invention referred to in FIG. 2 through FIG. 19, which may be performed for the design intents and associated shapes used in photoresist mask patterns 103P and 104P referenced in FIGS. 19A and 19D. The patterning of target layer 101P, referenced in FIG. 19, may be associated with the patterning of crystalline silicon fins that may be subsequently used in the fabrication of three dimensional transistors such as fin-FETs or triple-gate FETs requiring smaller pitch than that available using a single mask to pattern the layer. In alternative embodiments, other process flows may be used to analogously form structures such as gates for other types of transistors as well as metal interconnects using a metal trench fill and chemical mechanical polish CMP planarization process as described above in reference to portion of one signal layer 200 of the double patterning process depicted in FIG. 2.

Figure 20:
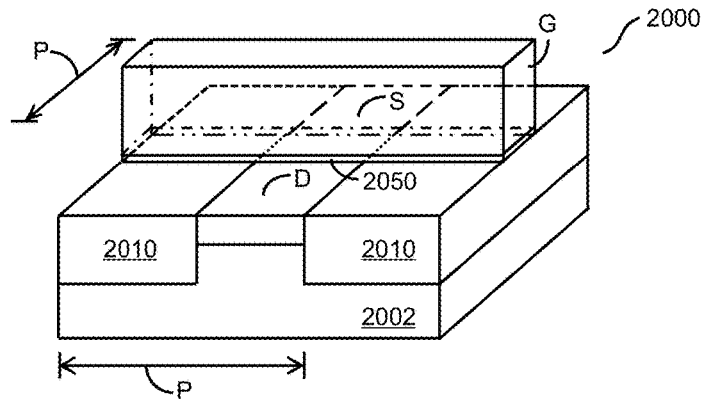
FIG. 20 depicts a simplified exemplary perspective view of an insulated-gate field-effect-transistor (IG-FET).

FIG. 20 depicts a simplified exemplary perspective view of an insulated-gate field-effect-transistor (IG-FET) 2000. IG-FET 2000 may include a crystalline silicon substrate 2002, shallow trench isolation 2010 (STI dielectric) formed on each side of a crystalline silicon pedestal, a gate dielectric 2050 formed between the crystalline silicon pedestal and a gate, G, formed as a stripe running lengthwise in the plane of FIG. 20 and over STI 2010. IG-FET 2000 may further include source S and drain D regions formed by implanting dopant atoms into the crystalline silicon pedestal in self aligned fashion on each side of gate G. The minimum pitch P normally available for the STI/crystalline silicon pedestal and/or the gate patterns is depicted by the arrows. The circuit density achievable is thus limited in-part by pitch P. The power wasted by IG-FET 2000 may be limited by leakage currents between D and S that are not under the control of G and may in aggregate over a multitude of transistors further limit circuit density.

Figure 21:
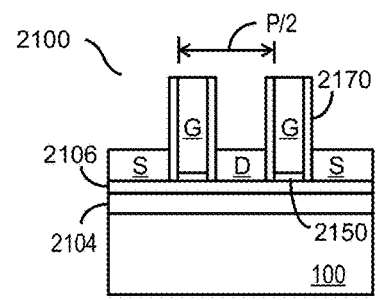
FIG. 21 depicts a simplified exemplary cross-section view of a fully-depleted silicon-on-insulator (FDSOI) FET manufactured using a double patterning process, in accordance with one embodiment of the present invention.

FIG. 21 depicts a simplified exemplary cross-section view of a fully-depleted silicon-on-insulator (FDSOI) FET 2100 manufactured using a double patterning process, in accordance with one embodiment of the present invention. FDSOI FET 2100 may include a starting wafer similar to starting wafer 100 referenced above in FIG. 19 except overlying BOX layer 2104, a crystalline silicon layer 2106 includes a thickness that may be thinner than crystalline silicon layer 101P used for fin-FET manufacture. FDSOI FET 2100 may further include a pair of connected gates G. In accordance with one embodiment of the present invention, the design intent used to form pair of connected gates G may include fill shapes patterned using the double patterning embodiments described herein with a pitch P/2 as depicted by the arrows to increase circuit density and improve manufacturability. In other words, shapes in the design intents referenced in FIG. 2 through FIG. 17 may correspond to shapes used to manufacture a FDSOI FET using a double-patterning manufacturing technology. Pair of connected gates G may have spacers 2170 formed between the gates G and raised doped silicon S and D regions. FDSOI FET 2100 may have reduced leakage characteristics because the silicon channel region immediately below the gates G may be formed thinner using a thin crystalline silicon layer 2106 so as to be fully depleted by the gates G when FDSOI FET 2100 is biased off.

Figure 22:
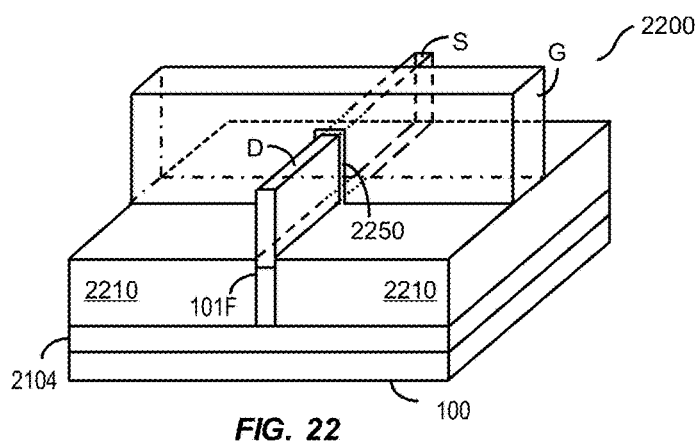
FIG. 22 depicts a simplified exemplary perspective view of a fin-FET transistor.

FIG. 22 depicts a simplified exemplary perspective view of a fin-FET transistor 2200. Fin-FET transistor 2200 may include starting wafer 100 referenced above in FIG. 19, fin 101F patterned similarly as target layer 101P referenced in FIG. 19, STI regions 2210, gate G formed overlaying and surrounding the portion of fin 101F above STI 2210, gate dielectric 2250 between the portion of fin 101F above STI 2210 and gate G, and S and D doped regions in the portion of fin 101F slightly below the surface of STI 2210 and on each side of gate G. The channel region may deplete fully when the gate is biased off because fin 101F is narrow and the gate surrounds the channel on at least two sides. Analogous fin-FET structures may be formed using the starting wafer 100 without BOX processing.

Figure 23:
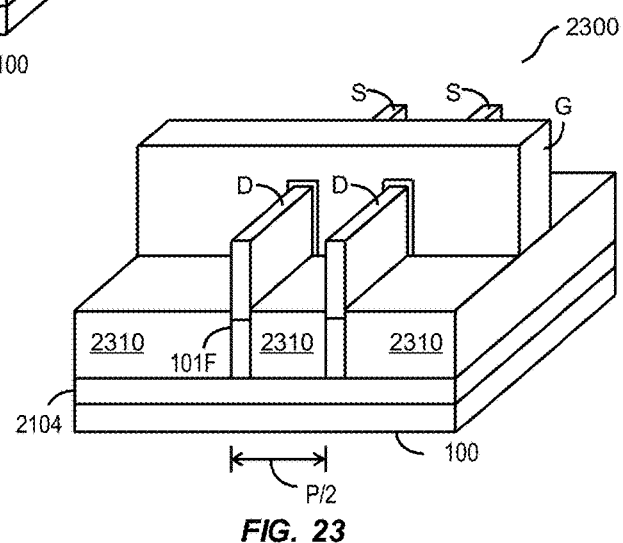
FIG. 23 depicts a simplified exemplary perspective view of a fin-FET transistor manufactured, in part, using the double patterning process depicted in FIG. 19, in accordance with one embodiment of the present invention.

FIG. 23 depicts a simplified exemplary perspective view of a fin-FET transistor 2300 manufactured, in part, using the double patterning process depicted in FIG. 19, in accordance with one embodiment of the present invention. Fin-FET transistor 2300 may include a pair of fins 101F with S and D respectively connected in parallel to form a single FET with double the current drive capability compared to fin-FET transistor 2200. STI 2310 may be formed on each side of the pair of fins 101F. Pair of fins 101F may be manufactured with pitch P/2, as depicted by the arrows, using double patterning technology as depicted in FIG. 19 providing higher circuit density that achievable using single mask patterning technology. The design intent used to form the pair of parallel connected fins 101F may include fill shapes patterned using the double patterning embodiments described herein with a pitch P/2 as depicted by the arrows to increase circuit density and improve manufacturability using embodiments of the present invention referred to in FIG. 2 through FIG. 17. In other words, shapes in the design intents referenced in FIG. 2 through FIG. 17 may correspond to shapes used to manufacture a fin-FET or triple-gate FET using a double-patterning manufacturing technology. Fill shapes using double-patterning may thus be generated and added to masks associated with photolithography patterns 103P, 104P to improve the manufacturability of fins 101P for fin-FET transistor 2300 before the double-patterning wafer process for associated respective photolithography sequences referenced in FIG. 19. It would be understood that BOX processing does not limit the use of target layer 101P, referenced in FIG. 19, for patterning of crystalline silicon fins 101F that may be subsequently used in the fabrication of three dimensional transistors such as fin-FETs or triple-gate FETs.

Figure 24:
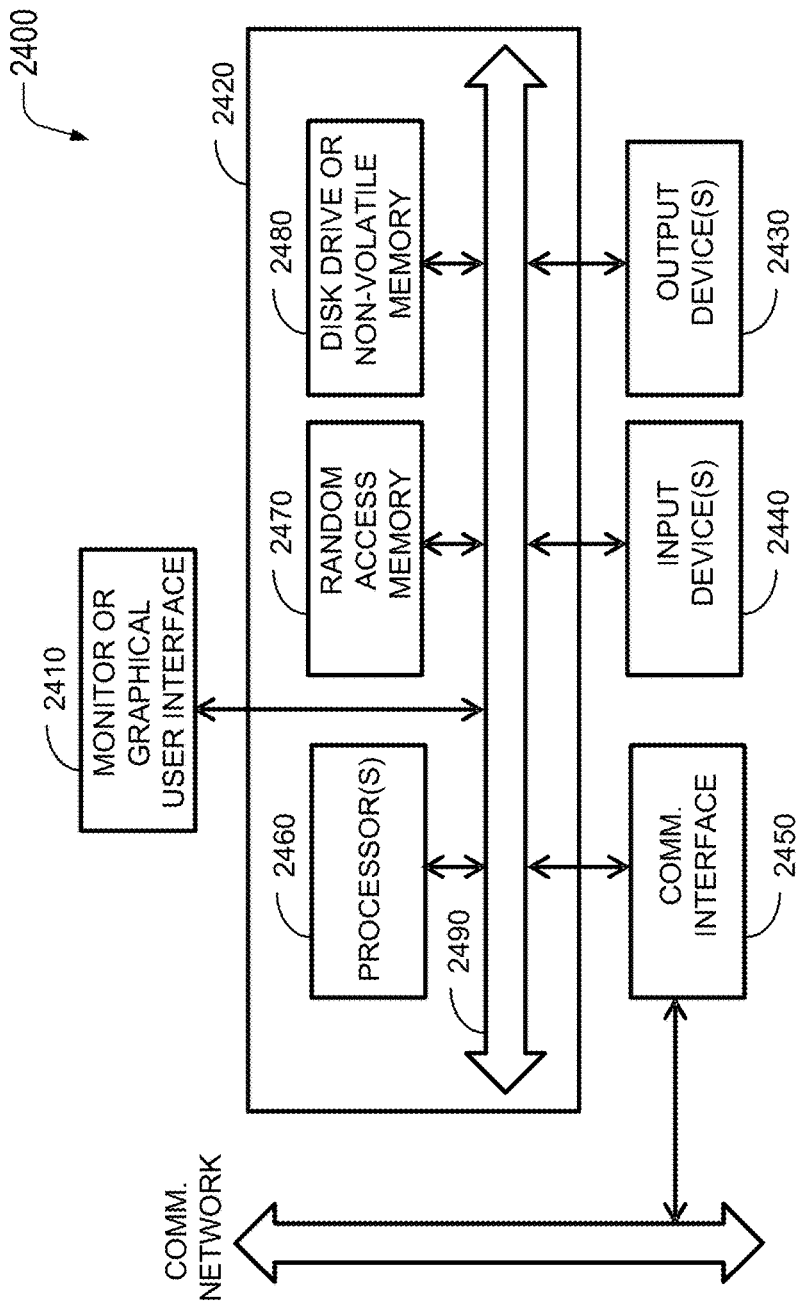
FIG. 24 is a block diagram of a computer system that may implement the features, aspects, and steps of the methods discussed herein.

FIG. 24 is a block diagram of a computer system that may implement the features, aspects, and steps of the methods discussed herein. FIG. 24 is merely illustrative of an embodiment incorporating the present invention and does not limit the scope of the invention as recited in the claims. One of ordinary skill in the art would recognize other variations, modifications, and alternatives.

In one embodiment, computer system 2400 typically includes a monitor 2410, a computer 2420, user output devices 2430, user input devices 2440, communications interface 2450, and the like.

As shown in FIG. 24, computer 2420 may include a processor(s) 2460 that communicates with a number of peripheral devices via a bus subsystem 2490. These peripheral devices may include user output devices 2430, user input devices 2440, communications interface 2450, and a storage subsystem, such as random access memory (RAM) 2470 and disk drive 2480.

User input devices 2430 include all possible types of devices and mechanisms for inputting information to computer system 2420. These may include a keyboard, a keypad, a touch screen incorporated into the display, audio input devices such as voice recognition systems, microphones, and other types of input devices. In various embodiments, user input devices 2430 are typically embodied as a computer mouse, a trackball, a track pad, a joystick, wireless remote, drawing tablet, voice command system, eye tracking system, and the like. User input devices 2430 typically allow a user to select objects, icons, text and the like that appear on the monitor 2410 via a command such as a click of a button or the like.

User output devices 2440 include all possible types of devices and mechanisms for outputting information from computer 2420. These may include a display (e.g., monitor 2410), non-visual displays such as audio output devices, etc.

Communications interface 2450 provides an interface to other communication networks and devices. Communications interface 2450 may serve as an interface for receiving data from and transmitting data to other systems. Embodiments of communications interface 2450 typically include an Ethernet card, a modem (telephone, satellite, cable, ISDN), (asynchronous) digital subscriber line (DSL) unit, FireWire interface, USB interface, and the like. For example, communications interface 2450 may be coupled to a computer network, to a FireWire bus, or the like. In other embodiments, communications interfaces 2450 may be physically integrated on the motherboard of computer 2420, and may be a software program, such as soft DSL, or the like.

In various embodiments, computer system 2400 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 2420 includes one or more Xeon microprocessors from Intel as processor(s) 2460. Further, one embodiment, computer 2420 includes a UNIX-based operating system.

RAM 2470 and disk drive 2480 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 2470 and disk drive 2480 may be configured to store the basic programming and data constructs that provide the functionality of the present invention.

The various steps of the methods described herein may be encoded in computer instructions, such as software code modules, stored in a non-transitory computer memory. A processor of a computer system may execute the instructions in order to cause the computer system to perform the method. Software code modules and instructions that provide the functionality of the present invention may be stored, for example, in RAM 2470 and disk drive 2480. These software modules may be executed by processor(s) 2460. RAM 2470 and disk drive 2480 may also provide a repository for storing data used in accordance with the present invention.

RAM 2470 and disk drive 2480 may include a number of memories including a main random access memory (RAM) for storage of instructions and data during program execution and a read only memory (ROM) in which fixed non-transitory instructions are stored. RAM 2470 and disk drive 2480 may include a file storage subsystem providing persistent (non-volatile) storage for program and data files. RAM 2470 and disk drive 2480 may also include removable storage systems, such as removable flash memory.

Bus subsystem 2490 provides a mechanism for letting the various components and subsystems of computer 2420 communicate with each other as intended. Although bus subsystem 2490 is shown schematically as a single bus, alternative embodiments of the bus subsystem may utilize multiple busses.

FIG. 24 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above embodiments of the present invention are illustrative and not limiting. Various alternatives and equivalents are possible. Although, the invention has been described with reference to an exemplary signal layer process for manufacturing certain integrated circuit transistor components by way of an example, it is understood that the invention is not limited by the type of process nor the type of transistor components so long as the process of components may benefit from the use of fill shapes in a double-patterning technology. In addition, the technique and system of the present invention is suitable for use with a wide variety of electronic design automation (EDA) tools and methodologies for designing, testing, and/or manufacturing systems characterized by a combination of conserved, signal flow, and event or digital system of equations. The scope of the invention should, therefore, be determined not with reference to the above description, but instead should be determined with reference to the pending claims along with their full scope or equivalents.

What is claimed is:

1. A computer-implemented method for constructing a design characterized by a double patterning layer, the method comprising:
    receiving the design in a memory of the computer when the computer is invoked to construct the design, wherein the design includes a plurality of net shapes each previously routed in accordance with a netlist of the design;
    generating, using the computer, a plurality of fill shapes along a plurality of tracks associated with the plurality of net shapes, wherein the plurality of fill shapes and the plurality of net shapes are decomposable into two colors in accordance with a spacing constraint of the double patterning layer, wherein the plurality of fill shapes are not associated with the netlist of the design, wherein the plurality of fill shapes are present in at least one mask generated from the design when the at least one mask is prepared;
    decomposing the plurality of net shapes into the two colors in accordance with a graph;
    surrounding each decomposed net shape with a blocking region associated with a color of the two colors that corresponds to the color of the decomposed net shape to form a plurality of blocking regions; and
    constructing the plurality of fill shapes in accordance with the plurality of blocking regions.

2. The computer-implemented method of claim 1, wherein constructing further includes constructing each one of the plurality of fill shapes along a different one of the plurality of tracks except wherever one of the plurality of blocking regions is associated with the same color as the color associated with the each one of the plurality of fill shapes.

3. The computer-implemented method of claim 2, wherein any immediately adjacent tracks of the plurality of tracks are assigned to alternating different colors of the two colors, wherein constructing further includes associating each one of the plurality of fill shapes with the same color as the color associated with the track of the plurality of tracks that the fill shape is disposed along.

4. The computer-implemented method of claim 1, wherein surrounding further includes sizing each one of the plurality of blocking regions such that each blocking region overlaps the associated decomposed net shape in a direction along a longitudinal axis of the plurality of tracks by a value associated with a first shape to second shape constraint of the double patterning layer, wherein the first shape and the second shape are associated with the same color.

5. The computer-implemented method of claim 1, wherein surrounding further includes sizing each one of the plurality of blocking regions such that each blocking region overlaps the associated decomposed net shape in a direction orthogonal to a longitudinal axis of the plurality of tracks by a value associated with a track pitch constraint of the double patterning layer.

6. The computer-implemented method of claim 1, wherein the two colors include a first color and a second color different from the first color, wherein the plurality of tracks are each sequentially numbered and include a plurality of even numbered tracks and a plurality of odd numbered tracks, the method further comprising:
- assigning, using the computer, the first color to the plurality of even numbered tracks; and
- assigning, using the computer, the second color to the plurality of odd numbered tracks, thereby assigning any immediately adjacent tracks of the plurality of tracks to alternating different colors, when immediately adjacent tracks are not previously assigned to alternating different colors.

7. The computer-implemented method of claim 1, wherein the
- graph is characterized by having:
- a plurality of vertices each associated with a different one of the plurality of net shapes; and
- a plurality of edges each joining a pair of the plurality of vertices when an immediately adjacent pair of the plurality of net shapes associated with the pair of the plurality of vertices are constrained by the spacing constraint of the double patterning layer, the method further comprising:
- selecting a selected one of the plurality of net shapes in accordance with a minimum width constraint of the double patterning layer, wherein the selected net shape is disposed along one of the plurality of tracks;
- designating one of the plurality of vertices associated with the selected net shape to the color of the two colors that is associated with the color of the track upon which the selected net shape is disposed along;
- decomposing the plurality of vertices in the graph into the two colors in accordance with the designated one of the plurality of vertices; and
- assigning the two colors to the plurality of net shapes in accordance with the decomposed graph.

8. A computer system operative to:
- receive a design, characterized by a double patterning layer, in a memory of the computer when the computer is invoked to construct the design, wherein the design includes a plurality of net shapes each previously routed in accordance with a netlist of the design;
- generate a plurality of fill shapes along a plurality of tracks associated with the plurality of net shapes, wherein the plurality of fill shapes and the plurality of net shapes are decomposable into two colors in accordance with a spacing constraint of the double patterning layer, wherein the plurality of fill shapes are not associated with the netlist of the design, wherein the plurality of fill shapes are present in at least one mask generated from the design when the at least one mask is prepared;
- decompose the plurality of net shapes into the two colors in accordance with a graph;
- surround each decomposed net shape with a blocking region associated with a color of the two colors that corresponds to the color of the decomposed net shape to form a plurality of blocking regions; and
- construct the plurality of fill shapes in accordance with the plurality of blocking regions.

9. The computer system of claim 8 further operative to construct each one of the plurality of fill shapes along a different one of the plurality of tracks except wherever one of the plurality of blocking regions is associated with the same color as the color associated with the each one of the plurality of fill shapes.

10. The computer system of claim 9, wherein any immediately adjacent tracks of the plurality of tracks are assigned to alternating different colors of the two colors, the computer system further operative to associate each one of the plurality of fill shapes with the same color as the color associated with the track of the plurality of tracks that the fill shape is disposed along.

11. The computer system of claim 8 further operative to size each one of the plurality of blocking regions such that each blocking region overlaps the associated decomposed net shape in a direction along a longitudinal axis of the plurality of tracks by a value associated with a first shape to second shape constraint of the double patterning layer, wherein the first shape and the second shape are associated with the same color.

12. The computer system of claim 8 further operative to size each one of the plurality of blocking regions such that each blocking region overlaps the associated decomposed net shape in a direction orthogonal to a longitudinal axis of the plurality of tracks by a value associated with a track pitch constraint of the double patterning layer.

13. The computer system of claim 8, wherein the two colors include a first color and a second color different from the first color, wherein the plurality of tracks are each sequentially numbered and include a plurality of even numbered tracks and a plurality of odd numbered tracks, computer system further operative to:
- assign the first color to the plurality of even numbered tracks; and
- assign the second color to the plurality of odd numbered tracks, thereby operative to assign any immediately adjacent tracks of the plurality of tracks to alternating different colors, when immediately adjacent tracks are not previously assigned to alternating different colors.

14. The computer system of claim 8, wherein the
- graph is characterized by having:
- a plurality of vertices each associated with a different one of the plurality of net shapes; and
- a plurality of edges each joining a pair of the plurality of vertices when an immediately adjacent pair of the plurality of net shapes associated with the pair of the plurality of vertices are constrained by the spacing constraint of the double patterning layer, the computer system further operative to:
- select a selected one of the plurality of net shapes in accordance with a minimum width constraint of the double patterning layer, wherein the selected net shape is disposed along one of the plurality of tracks;
- designate one of the plurality of vertices associated with the selected net shape to the color of the two colors that is associated with the color of the track upon which the selected net shape is disposed along;
- decompose the plurality of vertices in the graph into the two colors in accordance with the designated one of the plurality of vertices; and
- assign the two colors to the plurality of net shapes in accordance with the decomposed graph.

15. A non-transitory computer-readable storage medium comprising instructions, which when executed by a computer, cause the computer to:
- receive a design, characterized by a double patterning layer, in a memory of the computer when the computer is invoked to construct the design, wherein the design includes a plurality of net shapes each previously routed in accordance with a netlist of the design;
- generate a plurality of fill shapes along a plurality of tracks associated with the plurality of net shapes, wherein the plurality of fill shapes and the plurality of net shapes are decomposable into two colors in accordance with a spacing constraint of the double patterning layer, wherein the plurality of fill shapes are not associated with the netlist of the design, wherein the plurality of fill shapes are present in at least one mask generated from the design when the at least one mask is prepared;
decompose the plurality of net shapes into the two colors in accordance with a graph;
surround each decomposed net shape with a blocking region associated with a color of the two colors that corresponds to the color of the decomposed net shape to form a plurality of blocking regions; and
construct the plurality of fill shapes in accordance with the plurality of blocking regions.

16. The non-transitory computer-readable storage medium of claim 15, wherein the instructions further cause the computer to construct each one of the plurality of fill shapes along a different one of the plurality of tracks except wherever one of the plurality of blocking regions is associated with the same color as the color associated with the each one of the plurality of fill shapes.

17. The non-transitory computer-readable storage medium of claim 16, wherein any immediately adjacent tracks of the plurality of tracks are assigned to alternating different colors of the two colors, wherein the instructions further cause the computer to associate each one of the plurality of fill shapes with the same color as the color associated with the track of the plurality of tracks that the fill shape is disposed along.

18. The non-transitory computer-readable storage medium of claim 15, wherein the instructions further cause the computer to size each one of the plurality of blocking regions such that each blocking region overlaps the associated decomposed net shape in a direction along a longitudinal axis of the plurality of tracks by a value associated with a first shape to second shape constraint of the double patterning layer, wherein the first shape and the second shape are associated with the same color.

19. The non-transitory computer-readable storage medium of claim 15, wherein the instructions further cause the computer to size each one of the plurality of blocking regions such that each blocking region overlaps the associated decomposed net shape in a direction orthogonal to a longitudinal axis of the plurality of tracks by a value associated with a track pitch constraint of the double patterning layer.

20. The non-transitory computer-readable storage medium of claim 15, wherein the two colors include a first color and a second color different from the first color, wherein the plurality of tracks are each sequentially numbered and include a plurality of even numbered tracks and a plurality of odd numbered tracks, wherein the instructions further cause the computer to:
assign the first color to the plurality of even numbered tracks; and
assign the second color to the plurality of odd numbered tracks, thereby operative to assign any immediately adjacent tracks of the plurality of tracks to alternating different colors, when immediately adjacent tracks are not previously assigned to alternating different colors.

21. The non-transitory computer-readable storage medium of claim 15, wherein the
graph is characterized by having:
a plurality of vertices each associated with a different one of the plurality of net shapes; and
a plurality of edges each joining a pair of the plurality of vertices when an immediately adjacent pair of the plurality of net shapes associated with the pair of the plurality of vertices are constrained by the spacing constraint of the double patterning layer, the instructions further causing the computer to:
select a selected one of the plurality of net shapes in accordance with a minimum width constraint of the double patterning layer, wherein the selected net shape is disposed along one of the plurality of tracks;
designate one of the plurality of vertices associated with the selected net shape to the color of the two colors that is associated with the color of the track upon which the selected net shape is disposed along;
decompose the plurality of vertices in the graph into the two colors in accordance with the designated one of the plurality of vertices; and
assign the two colors to the plurality of net shapes in accordance with the decomposed graph.

* * * * *